U S008588017B2

(12) United States Patent
Park et al.

(10) Patent No.: US 8,588,017 B2
(45) Date of Patent: Nov. 19, 2013

(54) MEMORY CIRCUITS, SYSTEMS, AND MODULES FOR PERFORMING DRAM REFRESH OPERATIONS AND METHODS OF OPERATING THE SAME

(75) Inventors: Chul-woo Park, Yongin-si (KR); Young-hyun Jun, Seoul (KR); Joo-sun Choi, Yongin-si (KR); Hong-sun Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 13/236,972

(22) Filed: Sep. 20, 2011

(65) Prior Publication Data

US 2012/0099389 A1    Apr. 26, 2012

(30) Foreign Application Priority Data

Oct. 20, 2010  (KR) .................. 10-2010-0102515

(51) Int. Cl.
*G11C 29/00* (2006.01)
(52) U.S. Cl.
CPC .................................... *G11C 29/808* (2013.01)
USPC ................... 365/200; 365/210.1; 365/185.12; 365/211; 365/230.01; 365/189.07
(58) Field of Classification Search
USPC ............ 365/200, 210.1, 185.12, 211, 230.01, 365/189.07
See application file for complete search history.

(56) References Cited

U.S. PATENT DOCUMENTS

| | | |
|---|---|---|
| 4,602,353 A | 7/1986 | Wawersig et al. |
| 4,636,986 A | 1/1987 | Pinkham |
| 4,710,927 A | 12/1987 | Miller |
| 4,752,929 A | 6/1988 | Kantz et al. |
| 4,797,850 A | 1/1989 | Amitai |
| 4,935,734 A | 6/1990 | Austin |
| 5,126,822 A | 6/1992 | Salters et al. |
| 5,126,975 A | 6/1992 | Handy et al. |
| 5,148,546 A | 9/1992 | Blodgett |
| 5,158,546 A | 10/1992 | Haber et al. |
| 5,173,905 A | 12/1992 | Parkinson et al. |
| 5,216,278 A | 6/1993 | Lin et al. |

(Continued)

FOREIGN PATENT DOCUMENTS

| | | |
|---|---|---|
| DE | 10 306149 A1 | 9/2004 |
| DE | 10 307548 A1 | 9/2004 |

(Continued)

OTHER PUBLICATIONS

Ahn Jin-Hong et al., "Adaptive Self Refresh Scheme for Battery Operated High-Density Mobile DRAM Applications", *Solid-State Circuits Conference*, Nov. 2006, pp. 319-322.

(Continued)

*Primary Examiner* — Thong Q Le
(74) *Attorney, Agent, or Firm* — Myers Bigel Sibley & Sajovec, P.A.

(57) ABSTRACT

A memory module can include a plurality of dynamic memory devices that each can include a dynamic memory cell array with respective regions therein, where the plurality of dynamic memory devices can be configured to operate the respective regions responsive to a command. A DRAM management unit can be on the module and coupled to the plurality of dynamic memory devices, and can include a memory device operational parameter storage circuit that is configured to store memory device operational parameters for the respective regions to affect operation of the respective regions responsive to the command.

31 Claims, 23 Drawing Sheets

(56) References Cited

U.S. PATENT DOCUMENTS

| | | |
|---|---|---|
| 5,241,133 A | 8/1993 | Mullen, III et al. |
| 5,262,990 A | 11/1993 | Mills et al. |
| 5,265,218 A | 11/1993 | Testa et al. |
| 5,270,964 A | 12/1993 | Bechtolsheim et al. |
| 5,278,796 A | 1/1994 | Tillinghast et al. |
| 5,282,177 A | 1/1994 | McLaury |
| 5,283,877 A | 2/1994 | Gastinel et al. |
| 5,360,992 A | 11/1994 | Lowrey et al. |
| 5,363,279 A | 11/1994 | Cha |
| 5,367,494 A | 11/1994 | Shebanow et al. |
| 5,383,148 A | 1/1995 | Testa et al. |
| 5,388,227 A | 2/1995 | McFarland |
| 5,402,388 A | 3/1995 | Wojcicki et al. |
| 5,440,519 A | 8/1995 | Mart et al. |
| 5,446,695 A | 8/1995 | Douse et al. |
| 5,455,200 A | 10/1995 | Bigler et al. |
| 5,465,229 A | 11/1995 | Bechtolsheim et al. |
| 5,467,455 A | 11/1995 | Gay et al. |
| 5,502,835 A | 3/1996 | Le et al. |
| 5,513,135 A | 4/1996 | Dell et al. |
| 5,519,251 A | 5/1996 | Sato et al. |
| 5,526,320 A | 6/1996 | Zagar et al. |
| 5,532,954 A | 7/1996 | Bechtolsheim et al. |
| 5,544,124 A | 8/1996 | Zagar et al. |
| 5,548,285 A | 8/1996 | Ford et al. |
| 5,559,749 A | 9/1996 | McLaury |
| 5,559,990 A | 9/1996 | Cheng et al. |
| 5,563,594 A | 10/1996 | Ford et al. |
| 5,563,838 A | 10/1996 | Mart et al. |
| 5,581,564 A | 12/1996 | Miller et al. |
| 5,598,376 A | 1/1997 | Merritt et al. |
| 5,604,714 A | 2/1997 | Manning et al. |
| 5,606,275 A | 2/1997 | Farhang et al. |
| 5,610,864 A | 3/1997 | Manning |
| 5,619,464 A | 4/1997 | Tran |
| 5,627,791 A | 5/1997 | Wright et al. |
| 5,629,897 A | 5/1997 | Iwamoto et al. |
| 5,640,364 A | 6/1997 | Merritt et al. |
| 5,652,724 A | 7/1997 | Manning |
| 5,655,105 A | 8/1997 | McLaury |
| 5,661,339 A | 8/1997 | Clayton |
| 5,661,677 A | 8/1997 | Rondeau, II et al. |
| 5,661,695 A | 8/1997 | Zagar et al. |
| 5,668,773 A | 9/1997 | Zagar et al. |
| 5,675,549 A | 10/1997 | Ong et al. |
| 5,682,354 A | 10/1997 | Manning |
| 5,696,732 A | 12/1997 | Zagar et al. |
| 5,699,317 A | 12/1997 | Sartore et al. |
| 5,703,813 A | 12/1997 | Manning et al. |
| 5,706,247 A | 1/1998 | Merritt et al. |
| 5,708,297 A | 1/1998 | Clayton |
| 5,708,611 A | 1/1998 | Iwamoto et al. |
| 5,717,654 A | 2/1998 | Manning |
| 5,721,859 A | 2/1998 | Manning |
| 5,721,862 A | 2/1998 | Sartore et al. |
| 5,724,288 A | 3/1998 | Cloud et al. |
| 5,729,503 A | 3/1998 | Manning |
| 5,729,504 A | 3/1998 | Cowles |
| 5,731,633 A | 3/1998 | Clayton |
| 5,751,553 A | 5/1998 | Clayton |
| 5,757,703 A | 5/1998 | Merritt et al. |
| 5,793,688 A | 8/1998 | McLaury |
| 5,796,673 A | 8/1998 | Foss et al. |
| 5,802,010 A | 9/1998 | Zagar et al. |
| 5,802,395 A | 9/1998 | Connolly et al. |
| 5,812,488 A | 9/1998 | Zagar et al. |
| 5,813,023 A | 9/1998 | McLaury |
| 5,828,606 A | 10/1998 | Mick |
| 5,831,931 A | 11/1998 | Manning |
| 5,831,932 A | 11/1998 | Merritt et al. |
| 5,838,177 A | 11/1998 | Keeth |
| 5,838,631 A | 11/1998 | Mick |
| 5,841,732 A | 11/1998 | Mick |
| 5,850,368 A | 12/1998 | Ong et al. |
| 5,859,541 A | 1/1999 | McMahan et al. |
| 5,859,792 A | 1/1999 | Rondeau, II et al. |
| 5,866,939 A | 2/1999 | Shin et al. |
| 5,867,446 A | 2/1999 | Konishi et al. |
| 5,870,347 A | 2/1999 | Keeth et al. |
| 5,875,134 A | 2/1999 | Cloud |
| 5,875,142 A | 2/1999 | Chevallier |
| 5,875,143 A | 2/1999 | Ben-Zvi |
| 5,875,151 A | 2/1999 | Mick |
| 5,882,211 A | 3/1999 | Choy et al. |
| 5,887,272 A | 3/1999 | Sartore et al. |
| 5,896,339 A | 4/1999 | McLaury |
| 5,907,512 A | 5/1999 | Parkinson et al. |
| 5,915,105 A | 6/1999 | Farmwald et al. |
| 5,917,758 A | 6/1999 | Keeth |
| 5,917,760 A | 6/1999 | Millar |
| 5,923,611 A | 7/1999 | Ryan |
| 5,945,886 A | 8/1999 | Millar |
| 5,946,265 A | 8/1999 | Cowles |
| 5,949,254 A | 9/1999 | Keeth |
| 5,949,261 A | 9/1999 | Field et al. |
| 5,949,657 A | 9/1999 | Karabatsos |
| 5,950,304 A | 9/1999 | Khandros et al. |
| 5,953,215 A | 9/1999 | Karabatsos |
| 5,953,263 A | 9/1999 | Farmwald et al. |
| 5,953,515 A | 9/1999 | Coteus et al. |
| 5,954,804 A | 9/1999 | Farmwald et al. |
| 5,963,463 A | 10/1999 | Rondeau, II et al. |
| 5,963,504 A | 10/1999 | Manning |
| 5,966,724 A | 10/1999 | Ryan |
| 5,973,951 A | 10/1999 | Bechtolsheim et al. |
| 5,986,948 A | 11/1999 | Cloud |
| 5,995,443 A | 11/1999 | Farmwald et al. |
| 6,002,613 A | 12/1999 | Cloud et al. |
| 6,002,627 A | 12/1999 | Chevallier |
| 6,016,282 A | 1/2000 | Keeth |
| 6,021,084 A | 2/2000 | McLaury |
| 6,032,214 A | 2/2000 | Farmwald et al. |
| 6,032,215 A | 2/2000 | Farmwald et al. |
| 6,034,897 A | 3/2000 | Estakhri et al. |
| 6,034,916 A | 3/2000 | Lee |
| 6,034,918 A | 3/2000 | Farmwald et al. |
| 6,035,365 A | 3/2000 | Farmwald et al. |
| 6,038,195 A | 3/2000 | Farmwald et al. |
| 6,040,997 A | 3/2000 | Estakhri |
| 6,044,032 A | 3/2000 | Li |
| 6,046,953 A | 4/2000 | Kiehl et al. |
| 6,048,753 A | 4/2000 | Farnworth et al. |
| 6,049,975 A | 4/2000 | Clayton |
| 6,060,905 A | 5/2000 | Bickford et al. |
| 6,065,093 A | 5/2000 | Dell et al. |
| 6,067,272 A | 5/2000 | Foss et al. |
| 6,069,504 A | 5/2000 | Keeth |
| 6,078,546 A | 6/2000 | Lee |
| 6,079,001 A | 6/2000 | Le et al. |
| 6,081,478 A | 6/2000 | Mick et al. |
| 6,084,434 A | 7/2000 | Keeth |
| 6,088,774 A | 7/2000 | Gillingham |
| 6,091,145 A | 7/2000 | Clayton |
| 6,094,399 A | 7/2000 | Mick |
| 6,101,152 A | 8/2000 | Farmwald et al. |
| 6,101,612 A | 8/2000 | Jeddeloh |
| 6,108,795 A | 8/2000 | Jeddeloh |
| 6,113,398 A | 9/2000 | Choy et al. |
| 6,125,078 A | 9/2000 | Ooishi et al. |
| 6,130,856 A | 10/2000 | McLaury |
| 6,133,627 A | 10/2000 | Khandros et al. |
| 6,134,151 A | 10/2000 | Estakhri et al. |
| 6,141,249 A | 10/2000 | Estakhri et al. |
| 6,143,981 A | 11/2000 | Glenn |
| 6,144,616 A | 11/2000 | Suzuki et al. |
| 6,172,938 B1 | 1/2001 | Suzuki et al. |
| 6,181,004 B1 | 1/2001 | Koontz et al. |
| 6,182,184 B1 | 1/2001 | Farmwald et al. |
| 6,202,138 B1 | 3/2001 | Estakhri et al. |
| 6,205,083 B1 | 3/2001 | Foss et al. |
| 6,208,168 B1 | 3/2001 | Rhee |
| 6,215,714 B1 | 4/2001 | Takemae et al. |
| 6,226,723 B1 | 5/2001 | Gustavson et al. |
| 6,229,200 B1 | 5/2001 | Mclellan et al. |

(56) References Cited

U.S. PATENT DOCUMENTS

| | | | |
|---|---|---|---|
| 6,232,659 | B1 | 5/2001 | Clayton |
| 6,239,619 | B1 | 5/2001 | Yuan et al. |
| 6,240,042 | B1 | 5/2001 | Li |
| 6,242,281 | B1 | 6/2001 | Mclellan et al. |
| 6,243,282 | B1 | 6/2001 | Rondeau, II et al. |
| 6,260,097 | B1 | 7/2001 | Farmwald et al. |
| 6,260,154 | B1 | 7/2001 | Jeddeloh |
| 6,262,895 | B1 | 7/2001 | Forthun |
| 6,262,918 | B1 | 7/2001 | Estakhri et al. |
| 6,262,938 | B1 | 7/2001 | Lee et al. |
| 6,266,285 | B1 | 7/2001 | Farmwald et al. |
| 6,276,844 | B1 | 8/2001 | Coteus et al. |
| 6,281,568 | B1 | 8/2001 | Glenn et al. |
| 6,295,572 | B1 | 9/2001 | Wu |
| 6,314,051 | B1 | 11/2001 | Farmwald et al. |
| 6,314,052 | B2 | 11/2001 | Foss et al. |
| 6,317,352 | B1 | 11/2001 | Halbert et al. |
| 6,324,120 | B2 | 11/2001 | Farmwald et al. |
| 6,326,810 | B1 | 12/2001 | Keeth |
| 6,330,683 | B1 | 12/2001 | Jeddeloh |
| 6,331,451 | B1 | 12/2001 | Fusaro et al. |
| 6,345,321 | B1 | 2/2002 | Litaize et al. |
| 6,349,068 | B2 | 2/2002 | Takemae et al. |
| 6,356,105 | B1 | 3/2002 | Volk |
| 6,356,106 | B1 | 3/2002 | Greeff et al. |
| 6,359,831 | B1 | 3/2002 | McLaury |
| 6,362,644 | B1 | 3/2002 | Jeffery et al. |
| 6,362,656 | B2 | 3/2002 | Rhee |
| 6,362,997 | B1 | 3/2002 | Fiedler et al. |
| 6,369,605 | B1 | 4/2002 | Bonella et al. |
| 6,373,768 | B2 | 4/2002 | Woo et al. |
| 6,374,337 | B1 | 4/2002 | Estakhri |
| 6,378,020 | B2 | 4/2002 | Farmwald et al. |
| 6,381,188 | B1 | 4/2002 | Choi et al. |
| 6,381,194 | B2 | 4/2002 | Li |
| 6,397,314 | B1 | 5/2002 | Estakhri et al. |
| 6,414,868 | B1 | 7/2002 | Wong et al. |
| 6,424,594 | B1 | 7/2002 | McLaury |
| 6,426,240 | B2 | 7/2002 | Isaak |
| 6,426,916 | B2 | 7/2002 | Farmwald et al. |
| 6,433,277 | B1 | 8/2002 | Glenn |
| 6,434,035 | B2 | 8/2002 | Miersch et al. |
| 6,437,600 | B1 | 8/2002 | Keeth |
| 6,438,057 | B1 | 8/2002 | Ruckerbauer |
| 6,438,060 | B1 | 8/2002 | Li et al. |
| 6,446,158 | B1 | 9/2002 | Karabatsos |
| 6,448,633 | B1 | 9/2002 | Yee et al. |
| 6,452,863 | B2 | 9/2002 | Farmwald et al. |
| 6,452,866 | B2 | 9/2002 | McLaury |
| 6,455,356 | B1 | 9/2002 | Glenn et al. |
| 6,459,651 | B1 | 10/2002 | Lee et al. |
| 6,469,369 | B1 | 10/2002 | Lee |
| 6,473,308 | B2 | 10/2002 | Forthun |
| 6,475,827 | B1 | 11/2002 | Lee et al. |
| 6,476,478 | B1 | 11/2002 | Swiss et al. |
| 6,480,409 | B2 | 11/2002 | Park et al. |
| 6,492,600 | B1 | 12/2002 | Jimarez et al. |
| 6,493,250 | B2 | 12/2002 | Halbert et al. |
| 6,493,789 | B2 | 12/2002 | Ware et al. |
| 6,496,404 | B1 | 12/2002 | Fiedler et al. |
| 6,496,897 | B2 | 12/2002 | Ware et al. |
| 6,498,766 | B2 | 12/2002 | Lee et al. |
| 6,501,161 | B1 | 12/2002 | Lee |
| 6,502,161 | B1 | 12/2002 | Perego et al. |
| 6,510,503 | B2 | 1/2003 | Gillingham et al. |
| 6,515,928 | B2 | 2/2003 | Sato et al. |
| 6,521,987 | B1 | 2/2003 | Glenn et al. |
| 6,525,406 | B1 | 2/2003 | Chung et al. |
| 6,538,951 | B1 | 3/2003 | Janzen et al. |
| 6,545,345 | B1 | 4/2003 | Glenn et al. |
| 6,546,446 | B2 | 4/2003 | Farmwald et al. |
| 6,553,450 | B1 | 4/2003 | Dodd et al. |
| 6,555,899 | B1 | 4/2003 | Chung et al. |
| 6,560,158 | B2 | 5/2003 | Choi et al. |
| 6,563,337 | B2 | 5/2003 | Dour |
| 6,563,746 | B2 | 5/2003 | Fujioka et al. |
| 6,563,759 | B2 | 5/2003 | Yahata et al. |
| 6,564,281 | B2 | 5/2003 | Farmwald et al. |
| 6,566,761 | B1 | 5/2003 | Sharma et al. |
| 6,567,321 | B2 | 5/2003 | Lee |
| 6,570,791 | B2 | 5/2003 | Roohparvar et al. |
| 6,576,992 | B1 | 6/2003 | Cady et al. |
| 6,580,036 | B2 | 6/2003 | Kim et al. |
| 6,580,159 | B1 | 6/2003 | Fusaro et al. |
| 6,584,032 | B2 | 6/2003 | Fujioka et al. |
| 6,584,037 | B2 | 6/2003 | Farmwald et al. |
| 6,590,822 | B2 | 7/2003 | Hwang et al. |
| 6,597,059 | B1 | 7/2003 | McCann et al. |
| 6,605,865 | B2 | 8/2003 | Jeong et al. |
| 6,605,866 | B1 | 8/2003 | Crowley et al. |
| 6,608,366 | B1 | 8/2003 | Fogelson et al. |
| 6,611,047 | B2 | 8/2003 | Hu et al. |
| 6,616,436 | B1 | 9/2003 | Lee et al. |
| 6,621,496 | B1 | 9/2003 | Ryan |
| 6,621,760 | B1 | 9/2003 | Ahmad et al. |
| 6,625,687 | B1 | 9/2003 | Halbert et al. |
| 6,627,976 | B1 | 9/2003 | Chung et al. |
| 6,630,728 | B2 | 10/2003 | Glenn |
| 6,639,308 | B1 | 10/2003 | Crowley et al. |
| 6,646,339 | B1 | 11/2003 | Ku et al. |
| 6,650,594 | B1 | 11/2003 | Lee et al. |
| 6,657,918 | B2 | 12/2003 | Foss et al. |
| 6,657,919 | B2 | 12/2003 | Foss et al. |
| 6,661,706 | B2 | 12/2003 | Kawai et al. |
| 6,665,190 | B2 | 12/2003 | Clayton |
| 6,665,219 | B2 | 12/2003 | Li |
| 6,665,224 | B1 | 12/2003 | Lehmann et al. |
| 6,674,313 | B2 | 1/2004 | Kurisu et al. |
| 6,677,662 | B1 | 1/2004 | Chung et al. |
| 6,677,663 | B1 | 1/2004 | Ku et al. |
| 6,684,496 | B2 | 2/2004 | Glenn |
| 6,690,191 | B2 | 2/2004 | Wu et al. |
| 6,696,747 | B1 | 2/2004 | Lee et al. |
| 6,697,295 | B2 | 2/2004 | Farmwald et al. |
| 6,700,187 | B2 | 3/2004 | Paek |
| 6,701,446 | B2 | 3/2004 | Tsern et al. |
| 6,704,818 | B1 | 3/2004 | Martin et al. |
| 6,713,322 | B2 | 3/2004 | Lee |
| 6,713,854 | B1 | 3/2004 | Kledzik et al. |
| 6,714,460 | B2 | 3/2004 | LaBerge |
| 6,717,255 | B2 | 4/2004 | Oggioni et al. |
| 6,717,884 | B2 | 4/2004 | Kim |
| 6,730,544 | B1 | 5/2004 | Yang |
| 6,731,548 | B2 | 5/2004 | Pax |
| 6,735,709 | B1 | 5/2004 | Lee et al. |
| 6,748,509 | B2 | 6/2004 | Litaize et al. |
| 6,750,545 | B1 | 6/2004 | Lee et al. |
| 6,751,113 | B2 | 6/2004 | Bhakta et al. |
| 6,751,144 | B2 | 6/2004 | Takahashi et al. |
| 6,751,696 | B2 | 6/2004 | Farmwald et al. |
| 6,753,597 | B1 | 6/2004 | Crowley et al. |
| 6,754,129 | B2 | 6/2004 | Khatri et al. |
| 6,754,132 | B2 | 6/2004 | Kyung |
| 6,756,658 | B1 | 6/2004 | Gillett et al. |
| 6,759,737 | B2 | 7/2004 | Seo et al. |
| 6,762,948 | B2 | 7/2004 | Kyun et al. |
| 6,770,961 | B2 | 8/2004 | Lee |
| 6,777,789 | B1 | 8/2004 | Glenn et al. |
| 6,779,074 | B2 | 8/2004 | Janzen |
| 6,779,097 | B2 | 8/2004 | Gillingham et al. |
| 6,795,899 | B2 | 9/2004 | Dodd et al. |
| 6,798,047 | B1 | 9/2004 | Miks et al. |
| 6,803,645 | B2 | 10/2004 | Paek |
| 6,807,598 | B2 | 10/2004 | Farmwald et al. |
| 6,812,552 | B2 | 11/2004 | Islam et al. |
| 6,819,599 | B2 | 11/2004 | Schaefer |
| 6,819,602 | B2 | 11/2004 | Seo et al. |
| 6,819,617 | B2 | 11/2004 | Hwang et al. |
| 6,820,181 | B2 | 11/2004 | Jeddeloh et al. |
| 6,825,062 | B2 | 11/2004 | Yee et al. |
| 6,826,113 | B2 | 11/2004 | Ellis et al. |
| 6,826,249 | B1 | 11/2004 | Younis |
| 6,833,609 | B1 | 12/2004 | Fusaro et al. |
| 6,834,014 | B2 | 12/2004 | Yoo et al. |

(56) References Cited

U.S. PATENT DOCUMENTS

| | | |
|---|---|---|
| 6,836,437 B2 | 12/2004 | Li et al. |
| 6,839,290 B2 | 1/2005 | Ahmad et al. |
| 6,841,414 B1 | 1/2005 | Hu et al. |
| 6,847,099 B1 | 1/2005 | Bancod et al. |
| 6,847,103 B1 | 1/2005 | Perez et al. |
| 6,853,059 B1 | 2/2005 | Jang |
| 6,853,938 B2 | 2/2005 | Jeddeloh |
| 6,854,042 B1 | 2/2005 | Karabatsos |
| 6,857,042 B1 | 2/2005 | Floman et al. |
| 6,858,919 B2 | 2/2005 | Seo et al. |
| 6,867,071 B1 | 3/2005 | Lee et al. |
| 6,873,032 B1 | 3/2005 | McCann et al. |
| 6,873,534 B2 | 3/2005 | Bhakta et al. |
| 6,885,086 B1 | 4/2005 | Fogelson et al. |
| 6,888,760 B2 | 5/2005 | LaBerge |
| 6,893,900 B1 | 5/2005 | Glenn |
| 6,895,474 B2 | 5/2005 | Ryan et al. |
| 6,898,648 B2 | 5/2005 | LaBerge |
| 6,912,168 B2 | 6/2005 | Parris et al. |
| 6,914,324 B2 | 7/2005 | Rapport et al. |
| 6,914,851 B1 | 7/2005 | Kiehl |
| 6,925,016 B2 | 8/2005 | Takahashi et al. |
| 6,930,900 B2 | 8/2005 | Bhakta et al. |
| 6,930,903 B2 | 8/2005 | Bhakta et al. |
| 6,930,949 B2 | 8/2005 | Schaefer |
| 6,931,483 B2 | 8/2005 | Janzen |
| 6,934,216 B2 | 8/2005 | Mori |
| 6,934,823 B2 | 8/2005 | Williams et al. |
| 6,955,945 B2 | 10/2005 | Rapport et al. |
| 6,961,269 B2 | 11/2005 | Royer |
| 6,967,125 B2 | 11/2005 | Fee et al. |
| 6,968,419 B1 | 11/2005 | Holman |
| 6,970,968 B1 | 11/2005 | Holman |
| 6,977,655 B2 | 12/2005 | Ryan |
| 6,980,021 B1 | 12/2005 | Srivastava et al. |
| 6,981,089 B2 | 12/2005 | Dodd et al. |
| 6,981,100 B2 | 12/2005 | Ryan et al. |
| 6,992,950 B2 | 1/2006 | Foss et al. |
| 7,000,062 B2 | 2/2006 | Perego et al. |
| 7,007,130 B1 | 2/2006 | Holman |
| 7,009,863 B2 | 3/2006 | Khatri et al. |
| 7,010,642 B2 | 3/2006 | Perego et al. |
| 7,016,228 B2 | 3/2006 | Kawai et al. |
| 7,016,549 B1 | 3/2006 | Utagawa |
| 7,017,002 B2 | 3/2006 | Perego et al. |
| 7,020,818 B2 | 3/2006 | Dour et al. |
| 7,023,741 B2 | 4/2006 | Nakamura et al. |
| 7,024,518 B2 | 4/2006 | Halbert et al. |
| 7,028,861 B2 | 4/2006 | Sayers et al. |
| 7,051,151 B2 | 5/2006 | Perego et al. |
| 7,058,776 B2 | 6/2006 | Lee |
| 7,061,053 B2 | 6/2006 | Yano et al. |
| 7,072,231 B2 | 7/2006 | Pax |
| 7,079,440 B2 | 7/2006 | Remaklus, Jr. et al. |
| 7,081,373 B2 | 7/2006 | Roeters et al. |
| 7,082,054 B2 | 7/2006 | Kawai et al. |
| 7,088,633 B2 | 8/2006 | Remaklus, Jr. et al. |
| 7,089,412 B2 | 8/2006 | Chen |
| 7,107,415 B2 | 9/2006 | Jeddeloh et al. |
| 7,110,322 B2 | 9/2006 | Farmwald et al. |
| 7,120,743 B2 | 10/2006 | Meyer et al. |
| 7,120,754 B2 | 10/2006 | Ryan et al. |
| 7,123,515 B2 | 10/2006 | Nakamura et al. |
| 7,123,521 B1 | 10/2006 | Louie et al. |
| 7,124,250 B2 | 10/2006 | Kyung |
| 7,126,863 B2 | 10/2006 | Janzen |
| 7,129,116 B2 | 10/2006 | Islam et al. |
| 7,130,217 B2 | 10/2006 | Kawai et al. |
| 7,130,228 B2 | 10/2006 | Janzen |
| 7,131,767 B2 | 11/2006 | Socci et al. |
| 7,133,972 B2 | 11/2006 | Jeddeloh |
| 7,136,958 B2 | 11/2006 | Jeddeloh |
| 7,136,971 B2 | 11/2006 | Litaize et al. |
| 7,138,823 B2 | 11/2006 | Janzen et al. |
| 7,139,290 B2 | 11/2006 | Braun |
| 7,139,852 B2 | 11/2006 | LaBerge |
| 7,142,461 B2 | 11/2006 | Janzen |
| 7,145,815 B2 | 12/2006 | Janzen |
| 7,149,824 B2 | 12/2006 | Johnson |
| 7,164,611 B2 | 1/2007 | Kinsley |
| 7,168,027 B2 | 1/2007 | Lee et al. |
| 7,180,778 B2 | 2/2007 | Kawai et al. |
| 7,180,797 B2 | 2/2007 | Pax |
| 7,181,639 B2 | 2/2007 | Chua-Eoan et al. |
| 7,184,350 B2 | 2/2007 | Remaklus, Jr. et al. |
| 7,184,916 B2 | 2/2007 | Resnick et al. |
| 7,185,426 B1 | 3/2007 | Hiner et al. |
| 7,194,559 B2 | 3/2007 | Salmon et al. |
| 7,200,062 B2 | 4/2007 | Kinsely et al. |
| 7,205,789 B1 | 4/2007 | Karabatsos |
| 7,210,059 B2 | 4/2007 | Jeddeloh |
| RE39,628 E | 5/2007 | Isaak |
| 7,222,213 B2 | 5/2007 | James |
| 7,224,621 B2 | 5/2007 | Nakamura et al. |
| 7,230,870 B2 | 6/2007 | Takai |
| 7,234,070 B2 | 6/2007 | James |
| 7,245,541 B2 | 7/2007 | Janzen |
| 7,249,236 B2 | 7/2007 | Jeddeloh et al. |
| 7,257,129 B2 | 8/2007 | Lee et al. |
| 7,260,685 B2 | 8/2007 | Lee et al. |
| 7,269,042 B2 | 9/2007 | Kinsley |
| 7,277,333 B2 | 10/2007 | Schaefer |
| 7,280,054 B2 | 10/2007 | Floman et al. |
| 7,285,979 B2 | 10/2007 | Janzen et al. |
| 7,289,386 B2 | 10/2007 | Bhakta et al. |
| 7,299,330 B2 | 11/2007 | Gillingham et al. |
| 7,301,846 B2 | 11/2007 | Petersen et al. |
| 7,307,863 B2 | 12/2007 | Yen et al. |
| 7,309,914 B2 | 12/2007 | Goodwin |
| 7,310,240 B2 | 12/2007 | Petersen |
| 7,310,458 B2 | 12/2007 | Wehrly, Jr. |
| 7,310,752 B2 | 12/2007 | Jeddeloh |
| 7,313,046 B2 | 12/2007 | Choi et al. |
| 7,315,473 B2 | 1/2008 | Kawai et al. |
| 7,315,969 B2 | 1/2008 | Jakobs |
| 7,321,628 B2 | 1/2008 | Kiehl |
| 7,324,352 B2 | 1/2008 | Goodwin |
| 7,340,558 B2 | 3/2008 | Lee et al. |
| 7,349,277 B2 | 3/2008 | Kinsley et al. |
| 7,353,329 B2 | 4/2008 | Ellis et al. |
| 7,366,827 B2 | 4/2008 | Lee |
| 7,369,447 B2 | 5/2008 | Louie et al. |
| 7,372,151 B1 | 5/2008 | Fan et al. |
| 7,379,316 B2 | 5/2008 | Rajan |
| 7,386,656 B2 | 6/2008 | Rajan et al. |
| 7,389,369 B2 | 6/2008 | Janzen |
| 7,392,338 B2 | 6/2008 | Rajan et al. |
| 7,393,226 B2 | 7/2008 | Clayton et al. |
| 7,394,149 B2 | 7/2008 | Clayton et al. |
| 7,398,342 B2 | 7/2008 | Janzen |
| 7,408,393 B1 | 8/2008 | Jain et al. |
| 7,411,857 B2 | 8/2008 | Schaefer |
| 7,423,885 B2 | 9/2008 | Cady et al. |
| 7,428,644 B2 | 9/2008 | Jeddeloh et al. |
| 7,429,788 B2 | 9/2008 | Clayton et al. |
| 7,432,774 B2 | 10/2008 | Greeff |
| 7,443,023 B2 | 10/2008 | Wehrly, Jr. et al. |
| 7,446,410 B2 | 11/2008 | Wehrly, Jr. et al. |
| 7,450,462 B2 | 11/2008 | Lee |
| 7,453,739 B2 | 11/2008 | Nakamura et al. |
| 7,466,761 B2 | 12/2008 | Pochmuller |
| 7,468,893 B2 | 12/2008 | Goodwin |
| 7,472,220 B2 | 12/2008 | Rajan et al. |
| 7,480,152 B2 | 1/2009 | Goodwin |
| 7,480,774 B2 | 1/2009 | Ellis et al. |
| 7,485,951 B2 | 2/2009 | Roper et al. |
| 7,490,009 B2 | 2/2009 | Gottlieb et al. |
| 7,495,334 B2 | 2/2009 | Rapport et al. |
| 7,504,284 B2 | 3/2009 | Ye et al. |
| 7,511,968 B2 | 3/2009 | Goodwin |
| 7,515,451 B2 | 4/2009 | Djordjevic |
| 7,515,453 B2 | 4/2009 | Rajan |
| 7,520,781 B2 | 4/2009 | Clayton et al. |
| 7,525,842 B2 | 4/2009 | Nguyen et al. |

(56) References Cited

U.S. PATENT DOCUMENTS

| | | |
|---|---|---|
| 7,542,297 B2 | 6/2009 | Wehrly, Jr. et al. |
| 7,542,304 B2 | 6/2009 | Rapport et al. |
| 7,542,305 B2 | 6/2009 | Petersen et al. |
| 7,557,443 B2 | 7/2009 | Ye et al. |
| 7,580,312 B2 | 8/2009 | Rajan et al. |
| 7,581,127 B2 | 8/2009 | Rajan et al. |
| 7,583,552 B2 | 9/2009 | Remaklus, Jr. et al. |
| 7,590,796 B2 | 9/2009 | Rajan et al. |
| 7,777,652 B2 | 8/2010 | Lee et al. |
| 2003/0018880 A1 | 1/2003 | Litaize et al. |
| 2003/0137048 A1 | 7/2003 | Cady et al. |
| 2003/0193000 A1 | 10/2003 | Leveridge |
| 2004/0136229 A1 | 7/2004 | Bhakta et al. |
| 2004/0178496 A1 | 9/2004 | Rapport et al. |
| 2004/0195666 A1 | 10/2004 | Partridge et al. |
| 2005/0018495 A1 | 1/2005 | Bhakta et al. |
| 2005/0056921 A1 | 3/2005 | Wehrly, Jr. et al. |
| 2005/0086417 A1 | 4/2005 | Meyer et al. |
| 2005/0195629 A1 | 9/2005 | Leddige et al. |
| 2005/0265506 A1 | 12/2005 | Foss et al. |
| 2006/0002217 A1 | 1/2006 | Walker et al. |
| 2006/0048385 A1 | 3/2006 | Cady et al. |
| 2006/0049502 A1 | 3/2006 | Goodwin et al. |
| 2006/0049513 A1 | 3/2006 | Goodwin |
| 2006/0050492 A1 | 3/2006 | Goodwin et al. |
| 2006/0050592 A1 | 3/2006 | Cady et al. |
| 2006/0053345 A1 | 3/2006 | Goodwin |
| 2006/0091521 A1 | 5/2006 | Cady et al. |
| 2006/0113678 A1 | 6/2006 | Roeters et al. |
| 2006/0123289 A1 | 6/2006 | Williams |
| 2006/0131716 A1 | 6/2006 | Cady et al. |
| 2006/0136683 A1 | 6/2006 | Meyer et al. |
| 2006/0143372 A1 | 6/2006 | Walker et al. |
| 2006/0175693 A1 | 8/2006 | Cady et al. |
| 2006/0195343 A1 | 8/2006 | Ruckschloss |
| 2006/0198238 A1 | 9/2006 | Partridge et al. |
| 2006/0255446 A1 | 11/2006 | Wehrly, Jr. |
| 2006/0277355 A1 | 12/2006 | Ellsberry et al. |
| 2007/0030752 A1 | 2/2007 | Yen et al. |
| 2007/0058471 A1 | 3/2007 | Rajan et al. |
| 2007/0076479 A1 | 4/2007 | Kim et al. |
| 2007/0115017 A1 | 5/2007 | Goodwin et al. |
| 2007/0138570 A1 | 6/2007 | Chong et al. |
| 2007/0165457 A1 | 7/2007 | Kim |
| 2007/0192563 A1 | 8/2007 | Rajan et al. |
| 2007/0195613 A1 | 8/2007 | Rajan et al. |
| 2007/0204075 A1 | 8/2007 | Rajan et al. |
| 2007/0205805 A1 | 9/2007 | Kiehl et al. |
| 2007/0211426 A1 | 9/2007 | Clayton et al. |
| 2007/0211711 A1 | 9/2007 | Clayton |
| 2007/0216445 A1 | 9/2007 | Raghavan et al. |
| 2007/0233938 A1 | 10/2007 | Cho et al. |
| 2007/0234021 A1 | 10/2007 | Ruberg et al. |
| 2007/0245094 A1 | 10/2007 | Lee et al. |
| 2007/0247194 A1 | 10/2007 | Jain |
| 2007/0258278 A1 | 11/2007 | Bacha et al. |
| 2007/0271409 A1 | 11/2007 | Miura et al. |
| 2008/0010435 A1 | 1/2008 | Smith et al. |
| 2008/0025108 A1 | 1/2008 | Rajan et al. |
| 2008/0025122 A1 | 1/2008 | Schakel et al. |
| 2008/0025136 A1 | 1/2008 | Rajan et al. |
| 2008/0027697 A1 | 1/2008 | Rajan et al. |
| 2008/0027702 A1 | 1/2008 | Rajan et al. |
| 2008/0027703 A1 | 1/2008 | Rajan et al. |
| 2008/0028135 A1 | 1/2008 | Rajan et al. |
| 2008/0028136 A1 | 1/2008 | Schakel et al. |
| 2008/0028137 A1 | 1/2008 | Schakel et al. |
| 2008/0056014 A1 | 3/2008 | Rajan et al. |
| 2008/0062773 A1 | 3/2008 | Rajan et al. |
| 2008/0063251 A1 | 3/2008 | Deutsch |
| 2008/0065820 A1 | 3/2008 | Gillingham et al. |
| 2008/0082763 A1 | 4/2008 | Rajan et al. |
| 2008/0103753 A1 | 5/2008 | Rajan et al. |
| 2008/0104314 A1 | 5/2008 | Rajan et al. |
| 2008/0109206 A1 | 5/2008 | Rajan et al. |
| 2008/0109595 A1 | 5/2008 | Rajan et al. |
| 2008/0109597 A1 | 5/2008 | Schakel et al. |
| 2008/0109598 A1* | 5/2008 | Schakel et al. ............... 711/106 |
| 2008/0115006 A1 | 5/2008 | Smith et al. |
| 2008/0120443 A1 | 5/2008 | Rajan et al. |
| 2008/0120458 A1 | 5/2008 | Gillingham et al. |
| 2008/0123459 A1 | 5/2008 | Rajan et al. |
| 2008/0126687 A1 | 5/2008 | Rajan et al. |
| 2008/0126688 A1 | 5/2008 | Rajan et al. |
| 2008/0126689 A1 | 5/2008 | Rajan et al. |
| 2008/0126690 A1 | 5/2008 | Rajan et al. |
| 2008/0126692 A1 | 5/2008 | Rajan et al. |
| 2008/0133825 A1 | 6/2008 | Rajan et al. |
| 2008/0170425 A1 | 7/2008 | Rajan |
| 2008/0181005 A1 | 7/2008 | Kawai et al. |
| 2008/0239857 A1 | 10/2008 | Rajan et al. |
| 2008/0239858 A1 | 10/2008 | Rajan et al. |
| 2008/0301349 A1 | 12/2008 | Bacha |
| 2008/0301370 A1 | 12/2008 | Djordjevic et al. |
| 2009/0024789 A1 | 1/2009 | Rajan et al. |
| 2009/0024790 A1 | 1/2009 | Rajan et al. |
| 2009/0051391 A1 | 2/2009 | Kwon |
| 2009/0080264 A1 | 3/2009 | Nakamura et al. |
| 2009/0138570 A1 | 5/2009 | Miura et al. |
| 2009/0138597 A1 | 5/2009 | Isaac et al. |
| 2009/0138624 A1 | 5/2009 | Isaac et al. |
| 2009/0138632 A1 | 5/2009 | Miura et al. |
| 2009/0150621 A1 | 6/2009 | Lee |
| 2010/0106917 A1 | 4/2010 | Ruberg et al. |

FOREIGN PATENT DOCUMENTS

| | | |
|---|---|---|
| DE | 10 309919 A1 | 9/2004 |
| DE | 10 328658 A1 | 2/2005 |
| DE | 10 344818 A1 | 4/2005 |
| DE | 10 2004 051345 A1 | 5/2006 |
| DE | 10 2004 053316 A1 | 5/2006 |
| DE | 10 2004 057232 A1 | 6/2006 |
| DE | 10 2005 035387 A1 | 2/2007 |
| DE | 10 2005 036528 A1 | 2/2007 |
| JP | 3276487 A | 12/1991 |
| JP | 9 134982 A | 5/1997 |
| JP | 9 162348 A | 6/1997 |
| JP | 10 116935 A | 5/1998 |
| JP | 10 217711 A | 9/1998 |
| JP | 3086273 B2 | 9/2000 |
| JP | 3304893 B2 | 7/2002 |
| JP | 3315501 B2 | 8/2002 |
| JP | 2010-152522 A | 7/2010 |
| WO | WO 2008/136417 A1 | 11/2008 |

OTHER PUBLICATIONS

Idei Youji et al., "Dual-Period Self-Refresh Scheme for Low-Power DRAM's with On-Chip PROM Mode Register", *IEEE Journal of Solid-State Circuits*, vol. 33, No. 2, Feb. 1998, pp. 253-259.

Metadata, From Wikipedia, the free encyclopedia, printed from the internet on May 9, 2011, http://en.wikipedia.org/wiki/Metadata.

US 7,366,920, 04/2008, Jeddeloh et al. (withdrawn)

* cited by examiner

FIG. 4
(a)
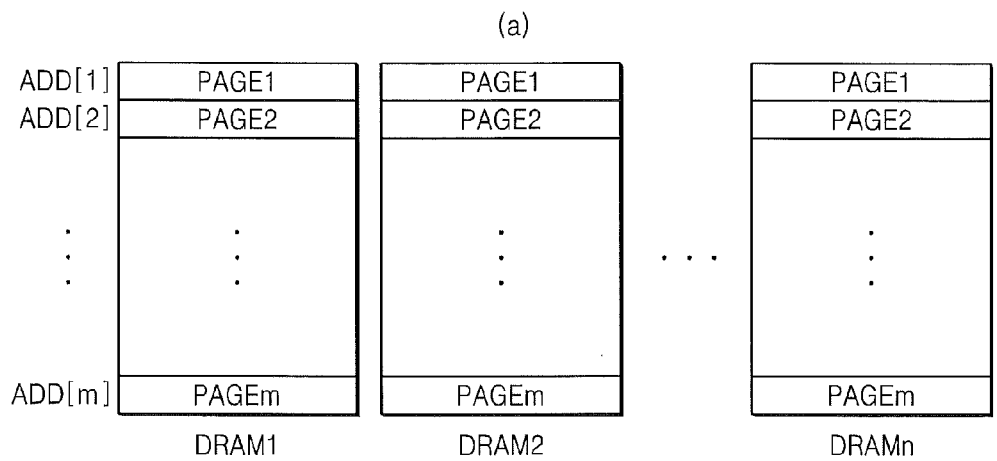
(b)
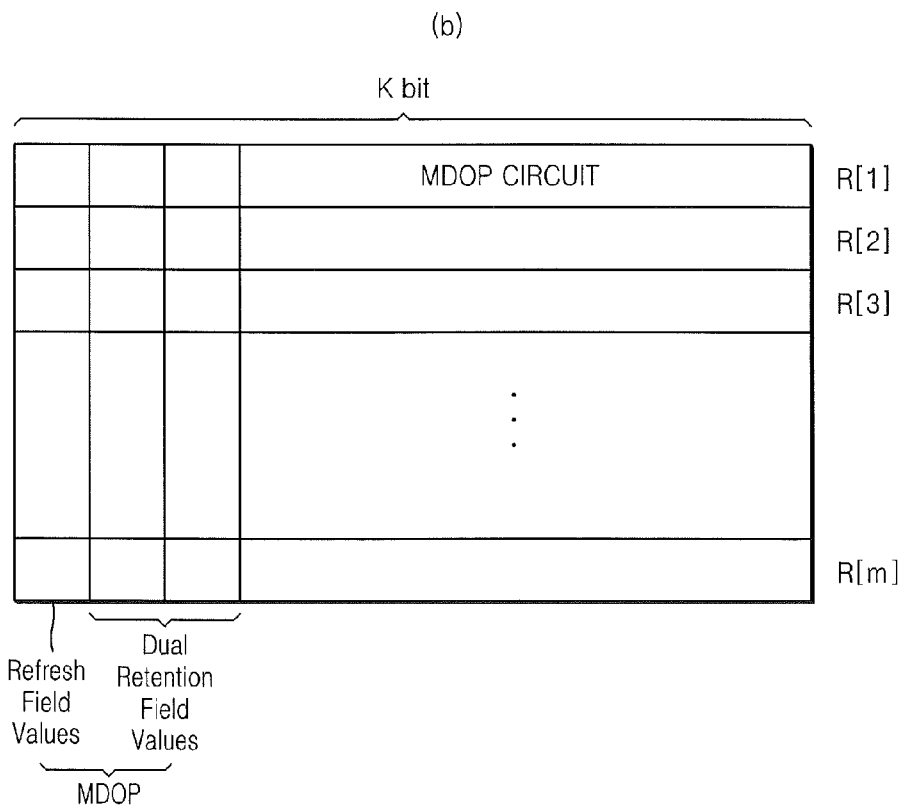

FIG. 18
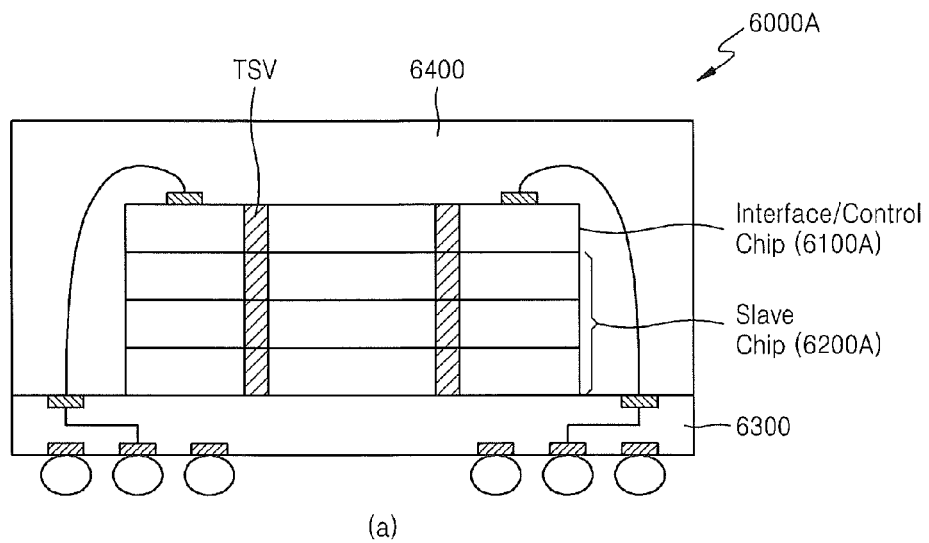
(a)
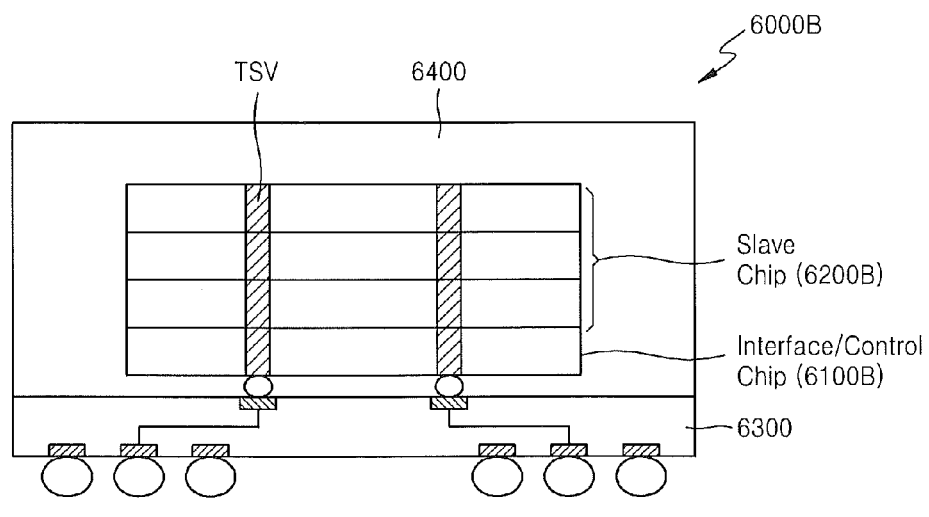
(b)

MEMORY CIRCUITS, SYSTEMS, AND MODULES FOR PERFORMING DRAM REFRESH OPERATIONS AND METHODS OF OPERATING THE SAME

CROSS-REFERENCE TO RELATED APPLICATIONS

This application claims the benefit of Korean Patent Application No. 10-2010-0102515, filed on Oct. 20, 2010, in the Korean Intellectual Property Office, the entire content of which is incorporated herein by reference.

BACKGROUND

The inventive concept relates to the field of semiconductor devices, and more particularly, to refresh for dynamic random access memory devices.

Semiconductor devices widely used in high-performance electronic systems have experienced improvements in both capacity and speed. A dynamic random access memory (DRAM) is a volatile memory which stores data corresponding to charge in capacitors. The charge stored in the capacitor may leak such that the data therein may be retained for a only limited time before degradation occurs to the point where the state of the data may be unreliable.

Various policies have been implemented to address data retention in DRAMs. For general-purpose use of the DRAM in various fields, most of the various policies are executed by a memory controller or a Central Processing Unit (CPU).

SUMMARY

Embodiments according to the inventive concept can provide memory circuits, systems and modules for performing DRAM refresh operations and methods of operating. Pursuant to these embodiments, a memory module can include a plurality of dynamic memory devices that each can include a dynamic memory cell array with respective regions therein, where the plurality of dynamic memory devices can be configured to operate the respective regions responsive to a command. A DRAM management unit can be on the module and coupled to the plurality of dynamic memory devices, and can include a memory device operational parameter storage circuit that is configured to store memory device operational parameters for the respective regions to affect operation of the respective regions responsive to the command.

In some embodiments according to the inventive concept, the memory device operational parameters can include refresh operational parameters to affect refresh operations performed in the respective regions. In some embodiments according to the inventive concept, the DRAM management unit can be configured to control refresh for a first region responsive to a first refresh operational parameter associated with the first region and to control refresh for a second region responsive to a second refresh operational parameter associated with the second region.

In some embodiments according to the inventive concept, a dynamic memory management circuit can include a dynamic random access memory (DRAM) operational parameter storage circuit, included in a DRAM management unit, where the DRAM operational parameter storage circuit can be configured to store refresh operational parameters for respective regions of DRAM configured to affect refresh operations of the respective regions separately.

In some embodiments according to the inventive concept, the refresh operational parameters can include refresh field values that are configured to indicate, for each region, whether a requested refresh operation for each region will be performed based on a comparison of the refresh field values for each region to a master time interval flag indicating a current portion of a refresh time interval.

In some embodiments according to the inventive concept, the requested refresh operation is performed when the refresh field value for an associated region matches the master time interval flag and is not performed when the refresh field value for the associated region does not match the master time interval flag. In some embodiments according to the inventive concept, the master time interval flag indicating the current portion of refresh time interval can be a first half of the refresh time interval or a second half of the refresh time interval. In some embodiments according to the inventive concept, a refresh driver circuit can be operatively coupled to the DRAM operational parameter storage circuit, and can be configured to invert the refresh field value for a region to which a current operation is directed if an address for the current operation is scheduled for a refresh request later during the current portion of the refresh time interval based on the comparison to the master time interval flag.

In some embodiments according to the inventive concept, a refresh driver circuit can be operatively coupled to the DRAM operational parameter storage circuit that can be configured to invert the refresh field value for a region to which a current operation is directed if an address for the current operation was scheduled for a refresh request earlier in a current portion of the refresh time interval but was skipped based on the comparison to the master time interval flag.

In some embodiments according to the inventive concept, the refresh operational parameters can include dual retention field values that are configured to indicate, for each region, one of a plurality of different refresh time intervals for use therewith. In some embodiments according to the inventive concept, the dual retention field values can be assigned to regions based on determinations of data retention for cells in the respective regions as a function of refresh frequency.

In some embodiments according to the inventive concept, a first region having less data retention is assigned dual retention field values indicating more frequent refresh and a second region having greater data retention is assigned dual retention field values indicating less frequent refresh than the first region. In some embodiments according to the inventive concept, the refresh operational parameters can be dual retention field values that are configured to indicate, for each region, whether a requested refresh operation for each region will be performed based on a comparison of the dual retention field values for each region to master time interval flags indicating a current portion of a low-frequency refresh time interval.

In some embodiments according to the inventive concept, the requested refresh operation can always be performed when the dual retention field value for an associated region for which the refresh operation is requested comprises a highest frequency refresh time interval that is less than the low-frequency refresh time interval. In some embodiments according to the inventive concept, the requested refresh operation can be performed when the dual retention field value for an associated region for which the refresh operation is requested matches the master time interval flags and is not performed when the dual retention field value does not match the master time interval flags.

In some embodiments according to the inventive concept, the requested refresh operation can be performed when the dual retention field value for an associated region for which the refresh operation is requested matches a least significant bit of the master time interval flags and is not performed when the dual retention field value does not match the least significant bit of the master time interval flags.

In some embodiments according to the inventive concept, the requested refresh operation can be performed when the dual retention field value for an associated region for which the refresh operation is requested matches all bits of the master time interval flags and is not performed when the dual retention field value does not match all the bits of the master time interval flags.

In some embodiments according to the inventive concept, the DRAM operational parameter storage circuit can be a register circuit including separate refresh field values for each region. In some embodiments according to the inventive concept, the refresh time interval can be a particular time interval within which a cell in a DRAM is refreshed to maintain data.

In some embodiments according to the inventive concept, a memory module can be a plurality of dynamic memory devices, on the module, each including a dynamic memory cell array with respective pages therein, the plurality of dynamic memory devices configured to operate the respective pages responsive to a command. A memory device operational parameter storage circuit can be included in a memory buffer device on the module, and can be operatively coupled to the plurality of dynamic memory devices, where the memory device operational parameter storage circuit can be configured to store memory device operational parameters for the respective pages to affect operation of the respective pages responsive to the command.

In some embodiments according to the inventive concept, a memory module can include a plurality of dynamic memory devices, on the module, where each can include a dynamic memory cell array with respective pages therein. A DRAM management unit, can be coupled to the plurality of dynamic memory devices and to an external interface of the module including a dynamic memory device operational parameter storage circuit that can be configured to store a respective refresh operational parameter for each of the respective pages to affect refresh operation in each of the respective pages.

In some embodiments according to the inventive concept, a memory system can include a memory controller device that is configured to write and read data in the memory system and a memory module, coupled to the memory controller device, the memory module can include a plurality of dynamic memory devices, on the module, that can each include a dynamic memory cell array with respective regions therein, the plurality of dynamic memory devices can be configured to operate the respective regions responsive to operations of the memory controller device. A DRAM management unit, can be on the module and can be coupled to the plurality of dynamic memory devices, and can include a memory device operational parameter storage circuit configured to store refresh operational parameters for the respective regions to affect operation of the respective regions responsive to the operations of the memory controller device.

In some embodiments according to the inventive concept, a stacked memory device can include a first integrated circuit layer including a DRAM management unit, including a memory device operational parameter storage circuit that can be configured to store a memory device operational parameter for each of respective regions of a dynamic memory cell array to affect operation of the respective regions responsive to a command. A second integrated circuit layer can be positioned above the first integrated circuit layer, including the dynamic memory cell array with respective regions therein, coupled to the first integrated circuit layer by a through silicon via.

BRIEF DESCRIPTION OF THE DRAWINGS

FIGS. 4A and 4B show exemplary implementations of a page structure of a memory cell array and a memory device operational parameters storage circuit according to an exemplary embodiment of the inventive concept.

FIGS. 18A and 18B are cross-sectional views of exemplary implementations of the semiconductor device shown in FIG. 17 according to another exemplary embodiment of the inventive concept.

DETAILED DESCRIPTION OF THE EMBODIMENTS ACCORDING TO THE INVENTIVE CONCEPT

Figure 1:
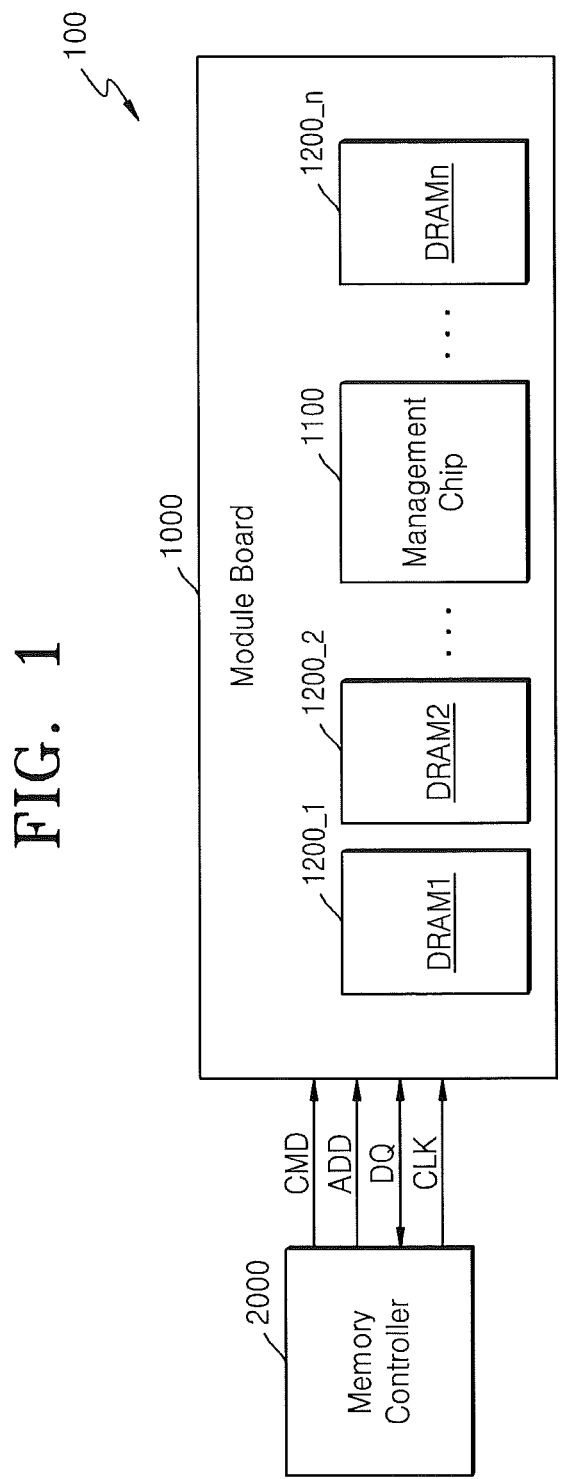
FIG. 1 is a block diagram of a memory module and a memory system according to an exemplary embodiment of the inventive concept.

Hereinafter, exemplary embodiments of the inventive concept will be described in detail with reference to the accompanying drawings, without any other intention than to provide thorough understanding of the inventive concept to those of ordinary skill in the art.

Memory devices include volatile memories such as dynamic random access memory (DRAM), static random access memory (SRAM), etc., and non-volatile memories which do not need to be refreshed, such as phase change random access memory (PRAM), resistive random access memory (RRAM) using variable resistance substances like complex metal oxides, and magnetic random access memory (MRAM) using ferromagnetic substances.

As appreciated by the present inventors, with the increased capacity and integration of DRAM, an increasingly heavy burden of supporting various policies to control DRAM may be imposed on the memory controller or the CPU, which may make it difficult to change to the policies, as the basic structure of DRAM has progressed with this approach in mind. For example, one such policy is to manage refresh operations of the DRAM using hardware to execute refresh operations at predetermined times. It may be difficult, however, to change the policies given the above approach.

Due to the finite data retention feature of the DRAM, validity of data of a normal cell may not be guaranteed after a specified time has elapsed. According to one exemplary refresh policy for DRAM, the time between refresh operations of a particular memory cell may be 64 ms, so that the particular memory cell is the subject of a refresh every 64 ms to maintain the data stored by the particular cell. However, as the size of the particular cell is reduced, the ability of the cell to retain data may also be reduced so that the cell should be refreshed more frequently, which may increase power consumption and reduce data input/output (I/O) bandwidth due to more bandwidth being allocated to refresh operations rather data operations (i.e., reads and writes).

In addition, to safe-guard the validity of data, different policies may be applied to different applications. For example, the adoption of an error correction circuit or the adoption of techniques to repair defective locations by substituting one address of a memory cell for another may also be used improve data integrity. However, it may be difficult to adopt various policies within the DRAM chip itself, as production of different DRAM chips implementing different policies for different applications may increase development and production costs. Moreover, the use of the different policies may reduce the usefulness of DRAM as a general-purpose memory.

In the following description, according to an exemplary embodiment of the inventive concept, semiconductor devices, memory modules, and systems which use various policies for improving memory operation characteristics are disclosed. It will be understood that the term "parameter" is used to refer to, for example, the affect on refresh operations, whereas the term value is used to refer to particular states that those parameters may take on to affect those refresh operations. It will be understood that the term "unit" refers to circuits, which operate in the manner described herein.

FIG. 1 is a block diagram of a memory module 1000 included in a memory system 100 according to an exemplary embodiment of the inventive concept.

As shown in FIG. 1, the memory module 1000 according to an exemplary embodiment of the inventive concept may include one or more semiconductor devices 1100 and 1200_1 through 1200_n. As shown in FIG. 1, the memory system 100 may include a memory controller 2000 coupled to the memory module. The memory controller 2000 provides various signals, e.g., a command CMD, an address ADD, and a clock signal CLK, for controlling the semiconductor device included in the memory module 1000, and can communicate with the memory module 1000 to provide data DQ to the memory module 1000 or to receive the data DQ from the memory module 1000. Hereinafter, operations according to an exemplary embodiment of the inventive concept will be described with reference to the memory module 1000.

The semiconductor devices 1100 and 1200_1 through 1200_n which may include, for example, a memory management chip 1100 (also referred to as a DRAM management unit) and one or more memory chips 1200_1 through 1200_n including memory cell arrays, are mounted on a module board. In some embodiments according to the inventive concept, the memory chips 1200_1 through 1200_n are DRAM chips that include the respective memory cell arrays.

Each of the memory cell arrays can be divided into a plurality of regions. For example, a memory cell array includes a plurality of banks, where a region is defined as one of the banks. The memory cell array may include a plurality of ranks, where a region is defined as a rank. It will be understood that, a page (of data) in a DRAM module can refer to a data block which is moved from a group of DRAM cells to a bit line sense amplifier upon application of a row address strobe (RAS) active command. Therefore, the memory cell array may include a plurality of pages. The following description will be made of operations according to an exemplary embodiment of the inventive concept on the assumption that the region of the memory cell array is defined as a page, however, other types of regions may be used.

At the memory module level of operation, the memory management chip 1100 directly and/or indirectly can control each of the DRAM chips 1200_1 through 1200_n. Various policies for improving memory performance are used in the memory management chip 1100, and in particular, functional blocks for performing operations in accordance with policies related to finite data retention (i.e., refresh policy) are used in the memory management chip 1100. When performing direct and/or indirect control operations with respect to the operations of each of the DRAM chips 1200_1 through 1200_n, the memory management chip 1100 can store memory device operational parameter values for each page of a memory cell array in each of the DRAM chips 1200_1 through 1200_n. The values can be stored in a memory device operational parameter storage circuit included in the memory management chip 1100. In some embodiments according to the inventive concept, the memory device operational parameter storage circuit can be a register.

In some embodiments according to the inventive concept, DRAM operational parameter values may be referred to as "meta-data" which may be data that is not data which is actually stored in the memory cells, but rather are values that affect operations of respective pages.

Figure 2:
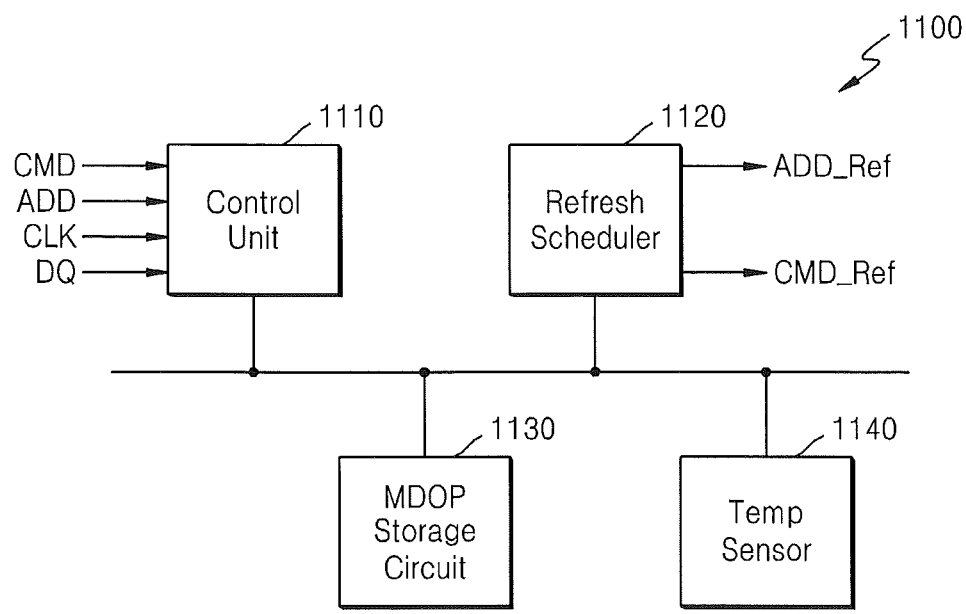
FIG. 2 is a block diagram of an exemplary implementation of a memory management chip shown in FIG. 1 according to an exemplary embodiment of the inventive concept.

FIG. 2 is a block diagram of an exemplary implementation of the memory management chip 1100 shown in FIG. 1 according to the inventive concept. Referring to FIGS. 1 and 2, the memory management chip 1100 may include a control unit 1110, a refresh scheduler 1120, a memory device operational parameter storage circuit 1130, and a temperature sensor 1140. The refresh scheduler 1120 schedules refresh operations with respect to each of a plurality of pages of a memory cell array. In some embodiments according to the inventive concept, the refresh scheduler 1120 schedules refresh operations for particular pages based on a specified frequency, however, whether the request refresh operation is actually issued to the particular page may depend on the value of the memory device operational parameter for that page stored in the memory device operational parameter storage circuit 1130. In some cases, the scheduled refresh may be skipped and re-scheduled for later, while in other cases the scheduled refresh may be performed, based on the value of the memory device operational parameter for that page. Accordingly, the memory device operational parameters for respective pages can affect refresh operations for the respective pages responsive to commands.

The control unit 1110 receives the command CMD, the address ADD, the clock signal CLK, and the data DQ provided from the memory controller 2000. The control unit 1110 may store a signal from the memory controller 2000 in a buffer of a predetermined size, and provide the signal to the DRAM chips 1200_1 through 1200_n. The control unit 1110 may also process a signal, such as the command CMD or the address ADD, provided from the memory controller 2000 by referring to information stored in the memory device operational parameter storage circuit 1130, and provide the processed signal to the DRAM chips 1200_1 through 1200_n.

The refresh scheduler 1120 manages refresh operations with respect to a memory cell array. For example, the refresh scheduler 1120 generates a refresh command CMD_Ref and a refresh address ADD_Ref therein irrespective of an external refresh command, and provides them to the DRAM chips 1200_1 through 1200_n. To this end, in the refresh scheduler 1120 may include a timer to generate information related to a refresh period and a timer to generate a refresh cycle. The refresh scheduler 1120 may control a refresh operation in the same manner as or in a similar way to an RAS only refresh (ROR) scheme, and may provide an active signal indicating the start and end of the refresh operation, cycle information of the refresh operation, and address information of a page to be refreshed to the DRAM chips 1200_1 through 1200_n. During the refresh operation, an active signal for read/write operations may be provided from the memory controller 2000 to the memory management chip 1100, and the control unit 1110 may provide information indicating, to the memory controller 2000, that the DRAM chips 1200_1 through 1200_n are in busy states by referring to the operating state of the refresh scheduler 1120.

The refresh scheduler 1120 manages refresh operations on a page-by-page basis. The refresh operation of the DRAM can be performed by moving data in a DRAM cell to a bit line sense amplifier through sequential application of an RAS active command without the read/write operations and then rewriting the data of the bit line sense amplifier to the DRAM cell.

When refresh is managed on a page-by-page basis, the refresh operation may be performed on some of the pages, and not performed on other pages. For example, if some pages are selected for the read/write operations during sequential refresh of pages, the refresh operation for the selected pages may be skipped during the sequential refresh operation. During a sequential refresh operation with respect to first through mth pages, when the read/write operations are performed on an (a+b)th page after completion of the refresh operation with respect to an ath page, the refresh operation for the (a+b)th page may be skipped.

The refresh scheduler 1120 may selectively perform the refresh on a particular page by referring to the memory device operational parameter for that page. In some embodiments according to the inventive concept, the memory device operational parameter for different pages can have different values, which may each affect whether a refresh is performed for each page differently. To this end, the memory device operational parameter storage circuit 1130 stores a memory device operational parameter for each page in each of the memory chips 1200_1 through 1200_n. The memory device operational parameter storage circuit 1130 may be implemented as a register in which a buffer of predetermined bits (e.g., 64 bits per page) is allocated for each page. The refresh scheduler 1120 generates control signals ADD_Ref and CMD_Ref for managing the refresh operations on a page-by-page basis by referencing to the memory device operational parameters stored in the storage circuit 1130. The temperature sensor 1140 shown in FIG. 2 is disposed to allow regulation/adjustment of the refresh period by referring to temperature information associated with the memory module 1000, wherein the refresh scheduler 1120 can receive the temperature information from the temperature sensor 1140 and may set the refresh period for a memory cell array by referring to the received temperature information.

Figure 3:
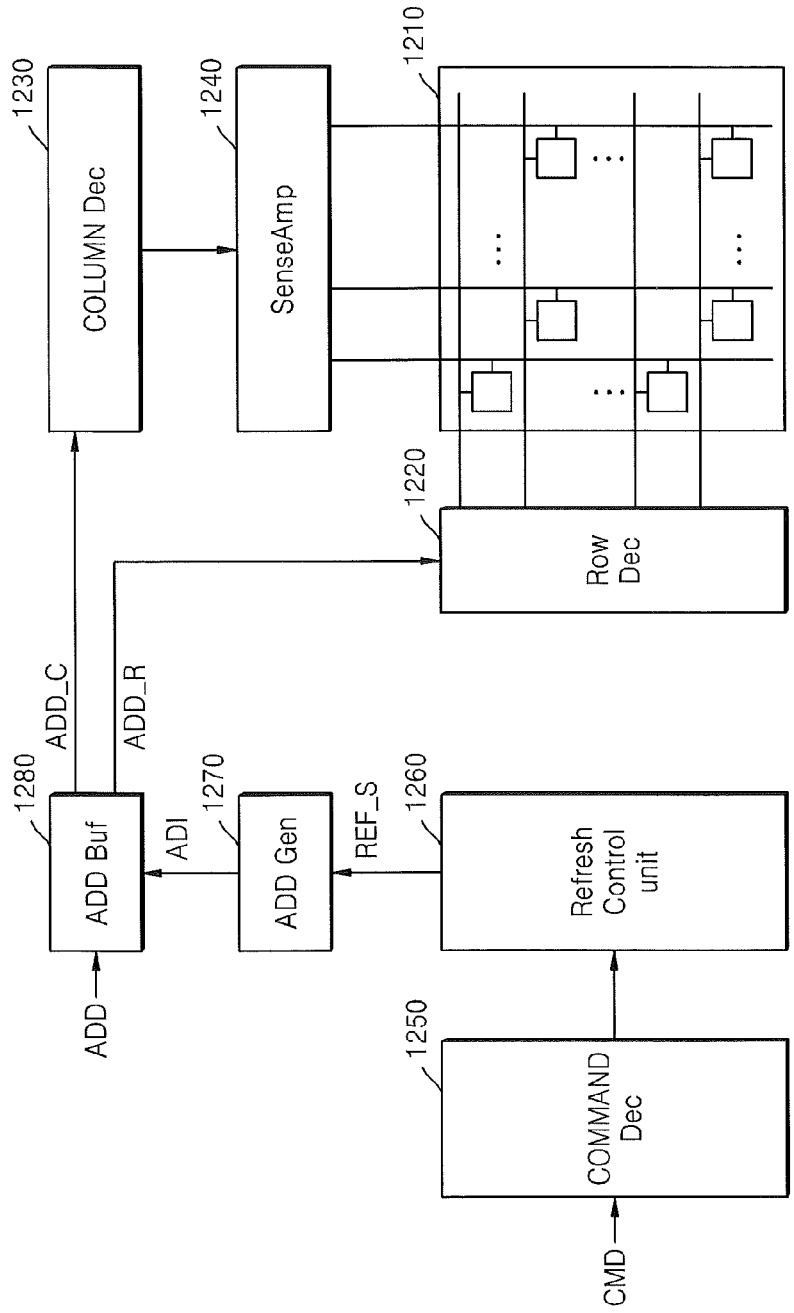
FIG. 3 is a block diagram of an exemplary implementation of a dynamic random access memory (DRAM) chip shown in FIG. 1 according to an exemplary embodiment of the inventive concept.

FIG. 3 is a block diagram of an exemplary implementation of the DRAM chip shown in FIG. 1 according to an exemplary embodiment of the inventive concept. The following description refers to one of the DRAM chips 1200_1 through 1200_n shown in FIG. 1 as an example. As shown in FIG. 3, the DRAM chip 1200_1 may include a memory cell array 1210 including a plurality of DRAM cells, a row decoder 1220, a column decoder 1230, and a sense amplifier 1240. The DRAM chip 1200_1 may include a command decoder 1250, a refresh control unit 1260, an internal address generator 1270, and an address buffer 1280 as peripheral circuits for driving the memory cell array 1210 or performing a refresh operation.

The command decoder 1250 generates an internal command for driving the DRAM chip 1200_1 by decoding an external command (e.g., a signal /RAS, /CAS, /WE, etc.) input from outside. An external address ADD is provided to the address buffer 1280, and a row address ADD_R for selecting a row and a column address ADD_C for selecting a column are provided to the row decoder 1220 and the column decoder 1230. The DRAM chip 1200_1 may enter an auto-refresh mode or a self-refresh mode according to a decoding result of the command decoder 1250, and the refresh control unit 1260 may generate a refresh signal REF_S in response to the decoding result of the command decoder 1250. The internal address generator 1270 may generate an internal address ADI for selecting a page on which a refresh operation is to be performed in response to the refresh signal REF_S, and provide the internal address ADI to the address buffer 1280.

The address buffer 1280 may include a switch therein, and may receive the external address ADD to provide the external address ADD to the row decoder 1220 for page selection during the read/write operations. On the other hand, when the DRAM chip 1200_1 enters the auto-refresh mode or the self-refresh mode, the address buffer 1280 may receive the internal address ADI to provide the internal address ADI to the row decoder 1220 for page selection. During the refresh operation of the refresh scheduler 1120 of the memory management chip 1120, the internal address generator 1270 is deactivated and the refresh address ADD_Ref is provided from the refresh scheduler 1120 to the address buffer 1280. In some embodiments according to the inventive concept, during the operation of the refresh scheduler 1120, the auto-refresh mode or the self-refresh mode in the DRAM chip 1200_1 is deactivated. In some embodiments according to the inventive concept, the refresh operation with respect to the memory cell array 1210 of the DRAM chip 1200_1 can be managed by the refresh scheduler 1120, such that a circuit for an auto-refresh operation and/or a self-refresh operation may be absent from the DRAM chip 1200_1.

FIGS. 4A and 4B show exemplary implementations of a page structure of a memory cell array and the memory device operational parameter storage circuit 1130 according to an exemplary embodiment of the inventive concept. Shown in FIG. 4A are n DRAM chips DRAM1 through DRAMn mounted on a module board, each of which may include a memory cell array having m pages. Upon application of an RAS active command to a memory module, data in a selected page on the memory module is moved to a bit line sense amplifier. A page may be selected by the same address, and data of a predetermined byte size (e.g., data of 8 kbytes) is moved to the bit line sense amplifier by the single address on the memory module. Therefore, as shown in FIG. 4A, a refresh operation may be issued to the same page (for example, page 1) in DRAM 1, DRAM 2, . . . DRAM M simultaneously using the memory device operational parameter value for page 1.

FIG. 4B shows an exemplary implementation of the memory device operational parameter storage circuit 1130 shown in FIG. 2. As shown in FIG. 4B, the memory device operational parameter storage circuit 1130 may be implemented as a register in which m first through mth storing regions R[1] through R[m] are allocated for the m pages on the memory module. For example, memory device operational parameter values associated with the first page Page 1 are stored in the 1st storing region R[1], and memory device operational parameter values associated with the second page Page 2 are stored in the 2nd storing region R[2]. A buffer of a predetermined size can be allocated to each storing region, and for example, a buffer of 64 bits may be allocated to each storing region.

The memory device operational parameter storage circuit 1130 may store therein information related to various policies for affecting the operation of the DRAM chips on a page-by-page basis. As shown in FIG. 4B, each of the m storing regions R[1] through R[m] is configured to store a plurality of parameters, and each storing region may include a buffer of 64 bits as mentioned above. Each storing region includes a plurality of fields, each of which stores information related to various policies for affecting the operation of the DRAM chips. For example, each field stores memory device operational parameter values Mdata_Ref related to refresh operations, such as a refresh field value related to execution of the refresh operation and a dual retention field value related to a refresh period. Although it is shown in FIG. 4B that the refresh field includes one bit and the dual retention field includes two bits, the number of bits in the fields can vary.

Figure 5:
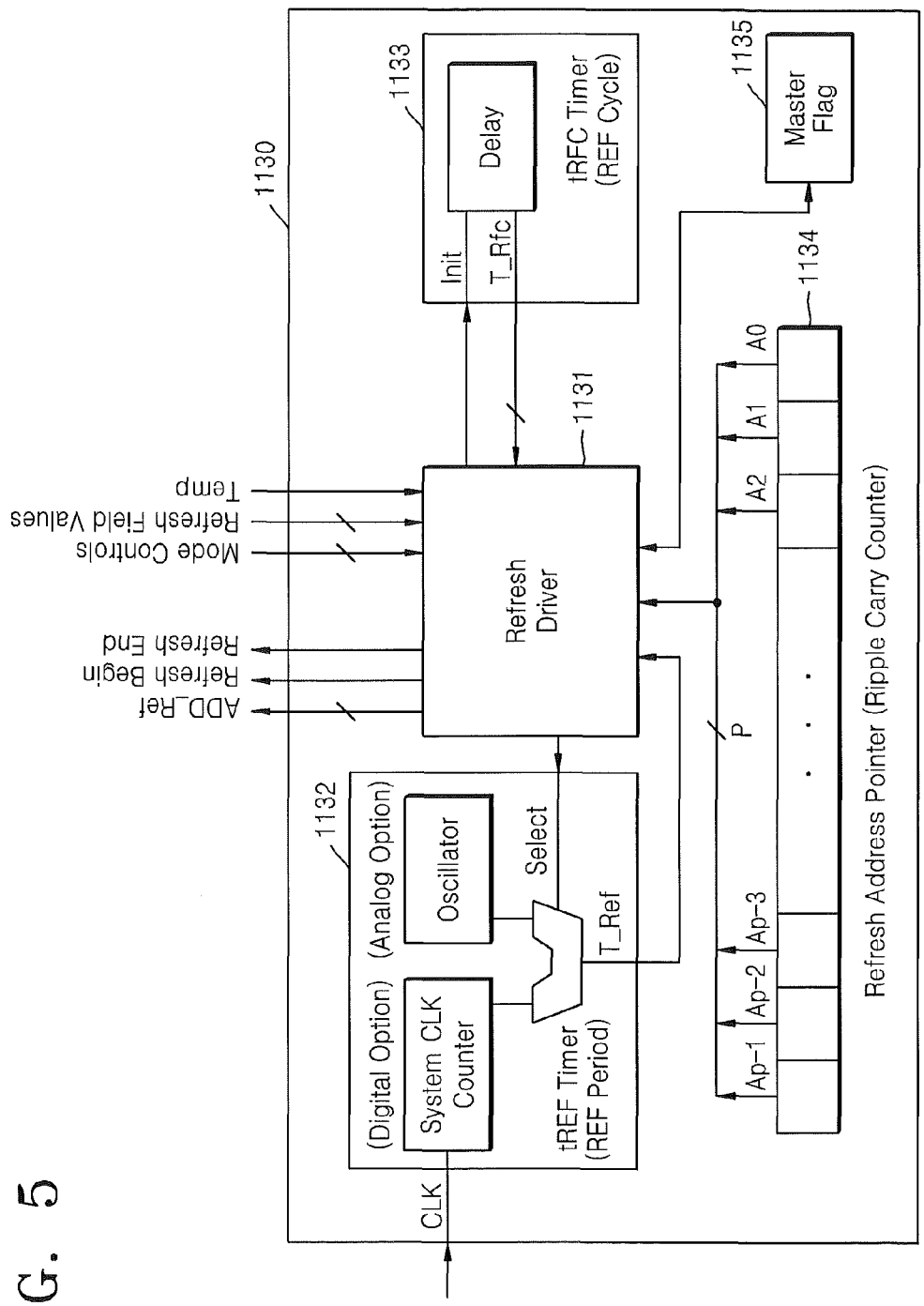
FIG. 5 is a block diagram of an exemplary implementation of a refresh scheduler shown in FIG. 2 according to an exemplary embodiment of the inventive concept.

FIG. 5 is a block diagram of an exemplary implementation of the refresh scheduler 1130 shown in FIG. 2. As shown in FIG. 5, the refresh scheduler 1130 may include a refresh driver 1131 for performing overall control of operations related to refresh, a period information generator 1132 for generating period information T_Ref related to a refresh time interval by counting the clock signal CLK, a cycle information generator 1133 for generating cycle information T_Rfc related to a refresh cycle based on a delay operation, and a refresh address pointer 1134 for generating a refresh address. The refresh address pointer 1134 may be implemented as a ripple carry counter in a form in which toggle flip-flops as many as bits of a row address are connected in series. If an address for selecting a page of a memory cell array includes p bits, the refresh address pointer 1134 generates a p-bit refresh address. The refresh scheduler 1130 may manage a refresh operation by comparing the value of a memory device operational parameter in the storage circuit with at least one master flag, and to this end, may further include a master flag storing unit 1135 for storing the master flag value. Various information generated in the refresh scheduler 1130 may be used as the master flag, and for example, one or more bits of the refresh address generated by the refresh address pointer 1134 may be used as the master flag.

The period information generator 1132 may generate the period information T_Ref related to a refresh time interval according to a digital scheme or an analog scheme. In FIG. 5, it is shown that a component for generating the period information T_Ref by counting the clock signal CLK and a component for generating an oscillation signal from an oscillator as the period information T_Ref are included in the period information generator 1132, and a multiplexer for providing one of the clock signal CLK and the oscillation signal as the period information T_Ref is further included in the period information generator 1132. However, the period information generator 1132 may also generate the period information T_Ref according to one of the digital scheme and the analog scheme. The cycle information generator 1133 is provided with a signal Init indicating the start of a refresh period from the refresh driver 1131, and generates the cycle information T_Rfc related to a refresh cycle by delaying the signal Init.

The refresh driver 1131 receives various control signals and information related to the refresh operation, such as Mode Controls, Field Values, Temp, etc. As one of various commands and information, mode control signals Mode Controls related to an operation mode may be provided to the refresh driver 1131. The mode control signals Mode Controls may be control commands provided from outside, or may be results of decoding an external command CMD of the control unit 1110 shown in FIG. 2. In response to the mode control signals Mode Controls, the operation mode of the refresh scheduler 1130 is controlled, and for example, the operation of the refresh driver 1131 may be switched on or off. The field values Field Values may be a memory device operational parameter that is used to affect the operation of refresh for different pages differently. The temperature information Temp may be referred to for setting a refresh time interval, and may be provided from the temperature sensor 1140 shown in FIG. 2 to the refresh driver 1131.

The refresh driver 1131 receives the refresh address ADD_Ref generated from the refresh address pointer 1134 and provides the same to the DRAM chip shown in FIG. 1. Accordingly, the ADD_Ref generated from the refresh address pointer 1134 can provide the basis for a requested refresh operation to be performed on the page corresponding to ADD_Ref. In particular, to provide the refresh address ADD_Ref, the refresh driver 1131 compares a refresh field value for the page corresponding to the refresh address ADD_Ref with the master flag value and selectively performs the requested refresh operation on the page corresponding to the refresh address ADD_Ref based on the result of the comparison. For example, for the refresh operation, various refresh commands Refresh Begin and Refresh End including refresh period and cycle information and the refresh address ADD_Ref for selecting a page are provided to the DRAM chip. By providing the refresh address ADD_Ref of the page on which the refresh operation is to be actually performed to the DRAM chip according to the result of comparison between the field value and the master flag value, the refresh operation may be selectively performed.

Figure 6:
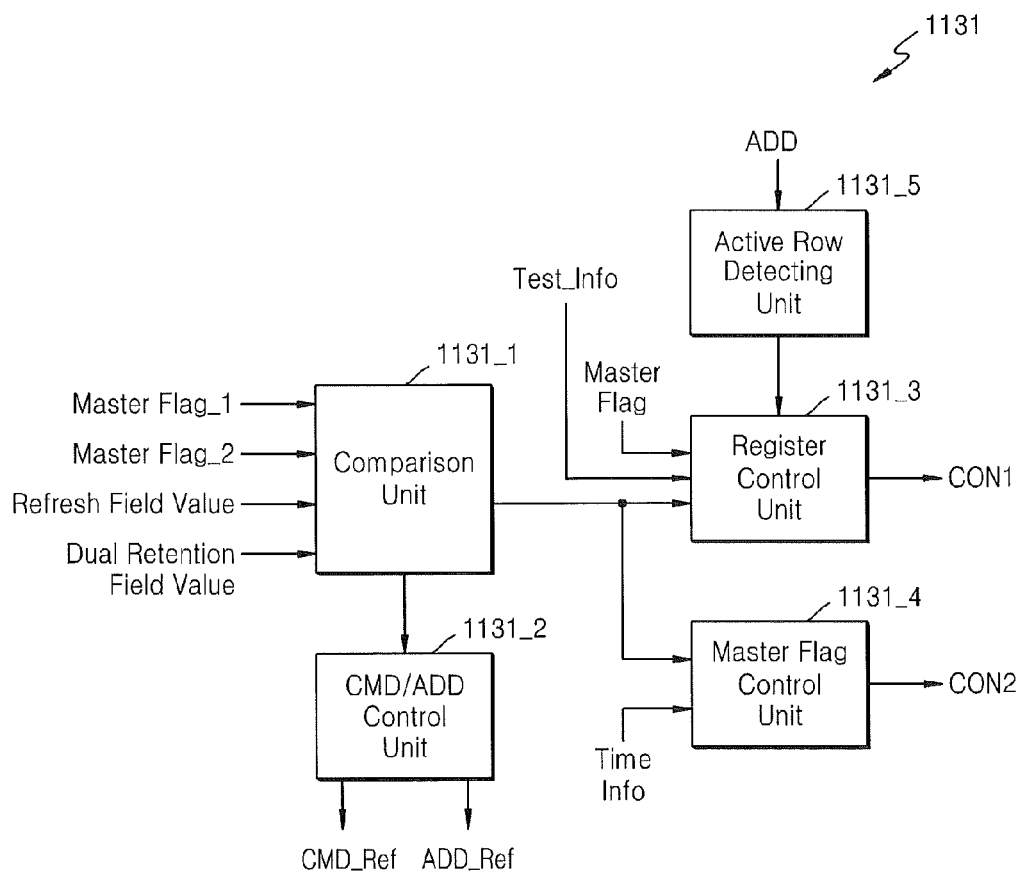
FIG. 6 is a block diagram of an exemplary implementation of a refresh driver shown in FIG. 5 according to an exemplary embodiment of the inventive concept.

FIG. 6 is a block diagram of an exemplary implementation of the refresh driver 1131 shown in FIG. 5 according to an exemplary embodiment of the inventive concept. As shown in FIG. 6, the refresh driver 1131 may include a comparison unit 1131_1, a command/address control unit 1131_2, a register control unit 1131_3, and a master flag control unit 1131_4. The refresh driver 1131 may further include an active row detecting unit 1131_5 for detecting an active state of a row for read/write operations with respect to the DRAM chip.

The comparison unit 1131_1 performs various comparison operations for controlling the refresh operation with respect to the page. The comparison unit 1131_1 receives one or more master time interval flags: Master Time Interval Flag_1 and Master Time Interval Flag_2 from the master flag storing unit 1135 shown in FIG. 5, and also receives at least one memory device operational parameter value related to the refresh operation, which may include the refresh field value related to execution of the requested refresh operation and a dual retention field value related to a refresh time interval of each page.

The command/address controller 1131_2 controls output of the command CMD_Ref and/or the address ADD_Ref for executing the requested refresh operation with respect to each page of the memory cell array based on the comparison performed by the comparison unit 1131_1. The register control unit 1131_3 also performs a control operation for changing the refresh field value in the storage circuit 1130 shown in FIG. 2, and receives and analyzes various information to generate a first control signal CON1 for changing the refresh field value related to the requested refresh operation stored in the storage circuit 1130. For example, the master time interval flag (e.g., the first master time interval flag Master Flag_1 and/or the second master time interval flag Master Flag_2) and the result from the comparison unit 1131_1 may be provided to the register control unit 1131_3. Test information Test_info, indicating results of testing the DRAM chips 1200_1 through 1200_n of FIG. 1, may also be provided to the register control unit 1131_3.

The active row detecting unit 1131_5 detects that a page of the memory cell array is opened (i.e., activated) for a read or write operation, for example, when a row of a page is activated, and provides the detection result to the register control unit 1131_3. The register control unit 1131_3 then receives address information regarding the page opened for the read or write operation from the active row detecting unit 1131_5, and may change a refresh field value for the page that corresponds to the received address information depending on, for example, when a refresh operation is scheduled to be requested using the master time interval flag information. The register control unit 1131_3 may also set the refresh field value in the storage circuit 1130 by using the test information Test_info obtained by testing the memory cell array. For instance, test information Test_info related to a refresh period of each page of the memory cell array is provided, and the register control unit 1131_3 may then change the refresh field value for that page in the storage circuit 1130 in response to the test information Test_info. The test information Test_info may be provided from an external tester. For example, the test information Test_info may be provided from test equipment outside the memory module 1000 or from a built-in self test (BIST) tester in each of the DRAM chips 1200_1 through 1200_n. When the test information Test_info is provided from external test equipment, the register control unit 1131_3 may write a fixed field value to the storage circuit 1130 by using the test information Test_info. When the BIST testers periodically test the memory cell array, the register control unit 1131_3 writes a field value related to the refresh operation in the storage circuit 1130 during an initial operation (or at power-up operation), or periodically writes a field value related to the refresh operation in the storage circuit 1130 during an operation of the memory module 1000.

In some embodiments according to the inventive concept, the tester can be used to determine how long each page of the memory can reliably retain data. In particular, some "weak" memory cells may leak charge more quickly than other "strong" memory cells. Pages that include the "weak" memory cells may, therefore, need to be refreshed more frequently so that the data stored therein can be retained despite the greater leakage of charge. For example, the tester may write a test pattern to the memory and then vary the refresh time interval used to refresh the different pages. The data stored in the pages can be read and compared to the test pattern which was originally written to determine if data was lost. Moreover, by repeatedly writing the test pattern and then changing the refresh time interval, the tester may determine the approximate refresh time interval for each page that may promote greater data retention within each page. The refresh time interval may therefore be stored in the storage circuit 1130 for each page.

The master flag control unit 1131_4 performs a control operation for changing a master time interval flag value, receives time information Time Info related to the refresh period, and generates a second control signal CON2 for changing the master time interval flag value. The register control unit 1131_3 may change the refresh field value for a particular page.

A detailed example of the refresh operation in the memory module 1000 according to an exemplary embodiment of the inventive concept will be described with reference to FIGS. 7 through 9.

Figure 7:
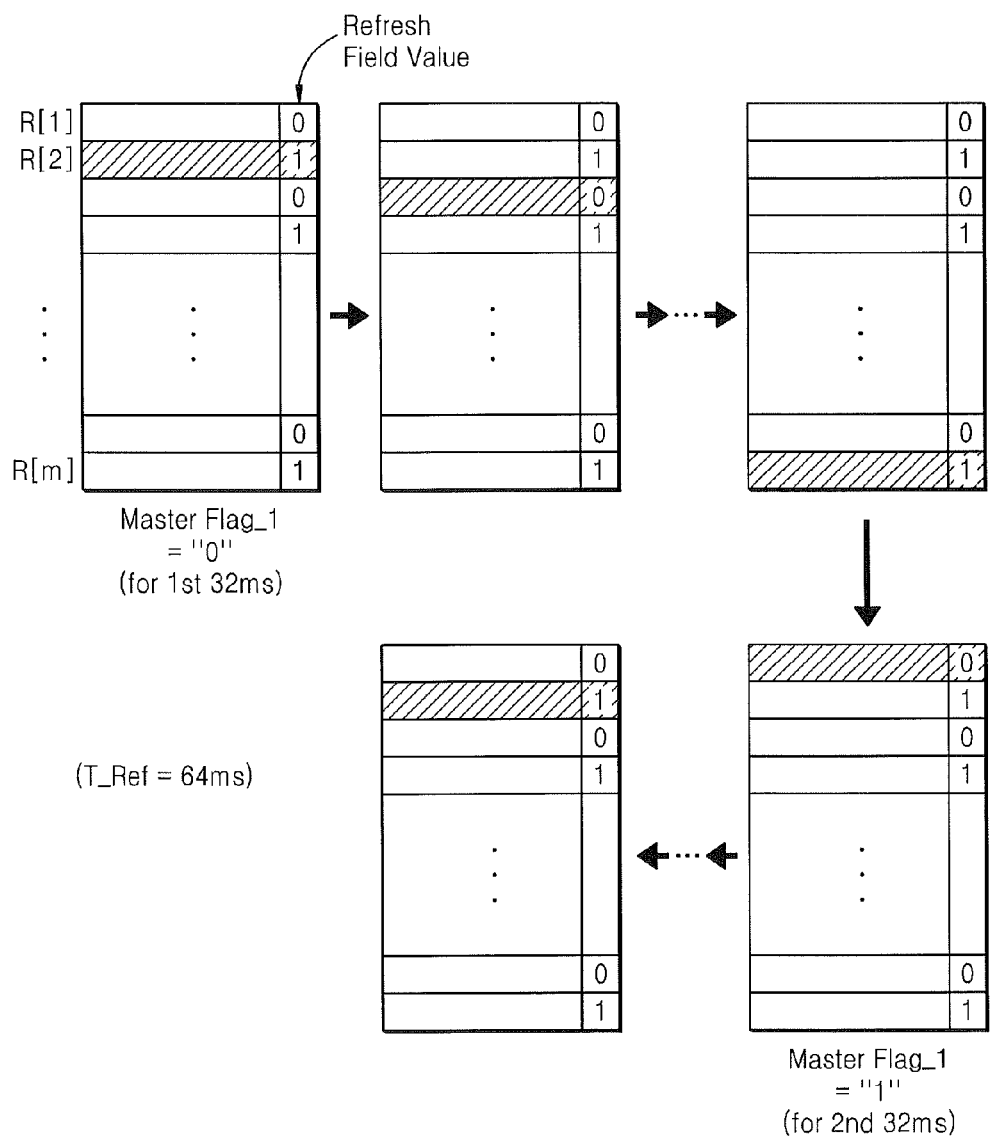
FIGS. 7 through 9 show examples of states of refresh field values corresponding to a refresh operation according to an exemplary embodiment of the inventive concept.

FIG. 7 is a diagram showing a first example of a state of a refresh field value according to a refresh operation in some embodiments according to the inventive concept. As shown in FIG. 7, the storage circuit 1130 includes first through mth storage regions configured to store memory operational parameter values for each of the respective m pages, and each of the storage regions includes a buffer of a plurality of bits. The refresh field value associated with the execution of the refresh operation may be one bit.

The refresh field values of the m storage regions R[1] through R[m] all may be set to "0" or "1", or as shown in FIG. 7, the refresh field values of the m storage regions R[1] through R[m] may be alternately set to "0" or "1". The first master time interval flag Master Flag_1 may alternate between "0" and "1". For example, for a refresh time interval T_Ref of 64 ms, the first master time interval flag can repeatedly toggle between "0" and "1", where the first master time interval flag is "0" for a first 32 ms and is "1" for a remaining 32 ms of the 64 ms. The first master time interval flag Master Flag_1 may be a signal generated from the master flag storing unit 1135 shown in FIG. 5 or the most significant bit (MSB) of the refresh address ADD_Ref generated by the refresh address pointer 1134.

In some embodiments according the inventive concept, the refresh field values for immediately adjacent pages in the storage circuit are different from one another. For example, as shown in FIG. 7, the refresh field value is "0" for page 1, and toggles as the page number increases, so that the refresh field value for page m is "1".

In some embodiments according the inventive concept, according to FIG. 7, the master time interval flag repeatedly toggles between "0" and "1", to provide different portions of the refresh time interval. For example, if cells in a particular page of memory are determined to be repeatedly refreshed at an interval of 64 ms to retain data reliably, the entire refresh time interval of 64 ms can be divided into first and second halves that are immediately adjacent in time to one another. The master time interval flag, therefore toggles every 32 ms.

In some embodiments according the inventive concept, the first master time interval flag Master Flag_1 and the refresh field value for the page requested for refresh are compared to one another. Whether the requested refresh of the page is actually performed can depend on the result of the comparison. In some embodiments according the inventive concept, the requested refresh is performed if the refresh field value for the page requested for refresh is equal to the first master time interval flag Master Flag_1. If, however, the refresh field value for the page requested for refresh is not equal to the first master time interval flag Master Flag_1, the requested refresh is skipped. Once the refresh field value comparison and the refresh operation based on the comparison result for the page are completed, the row address is incremented by one (i.e., the address for the next page requested for refresh), and refresh field value comparison and the refresh operation based on the comparison result for the next page are performed.

As further shown in FIG. 7, in some embodiments according to the inventive concept, requested refresh operations for pages that have a refresh field value of "0" are performed during the first portion of the refresh time interval because the first master time interval flag Master Flag_1 and the refresh field value are equal (e.g., both "0"). For example, the first master time interval flag Master Flag_1 being "0" for the first 32 ms (the first half of the refresh time interval) is compared to the refresh field value for page 1, which has a refresh field value of "0", whereupon the page is refreshed. Subsequently, the first master time flag Master Flag_1 toggles to "1" for the remaining second 32 ms (the second half of the refresh time interval), and is compared with the refresh field values for pages requested for refresh during the second half of the refresh time interval. Accordingly, pages that are requested for refresh having refresh field values of "0" during the first half of the refresh time interval are refreshed whereas pages that are requested for refresh having refresh field values of "1" during the first half of the refresh time interval are skipped. Further, pages that are requested for refresh having refresh field values of "0" during the second half of the refresh time interval are skipped whereas pages that are requested for refresh having refresh field values of "1" during the second half of the refresh time interval are performed. According to the foregoing operation, each page is refreshed once during the refresh time interval T_Ref while the condition of the refresh period T_Ref is satisfied.

Figure 8:
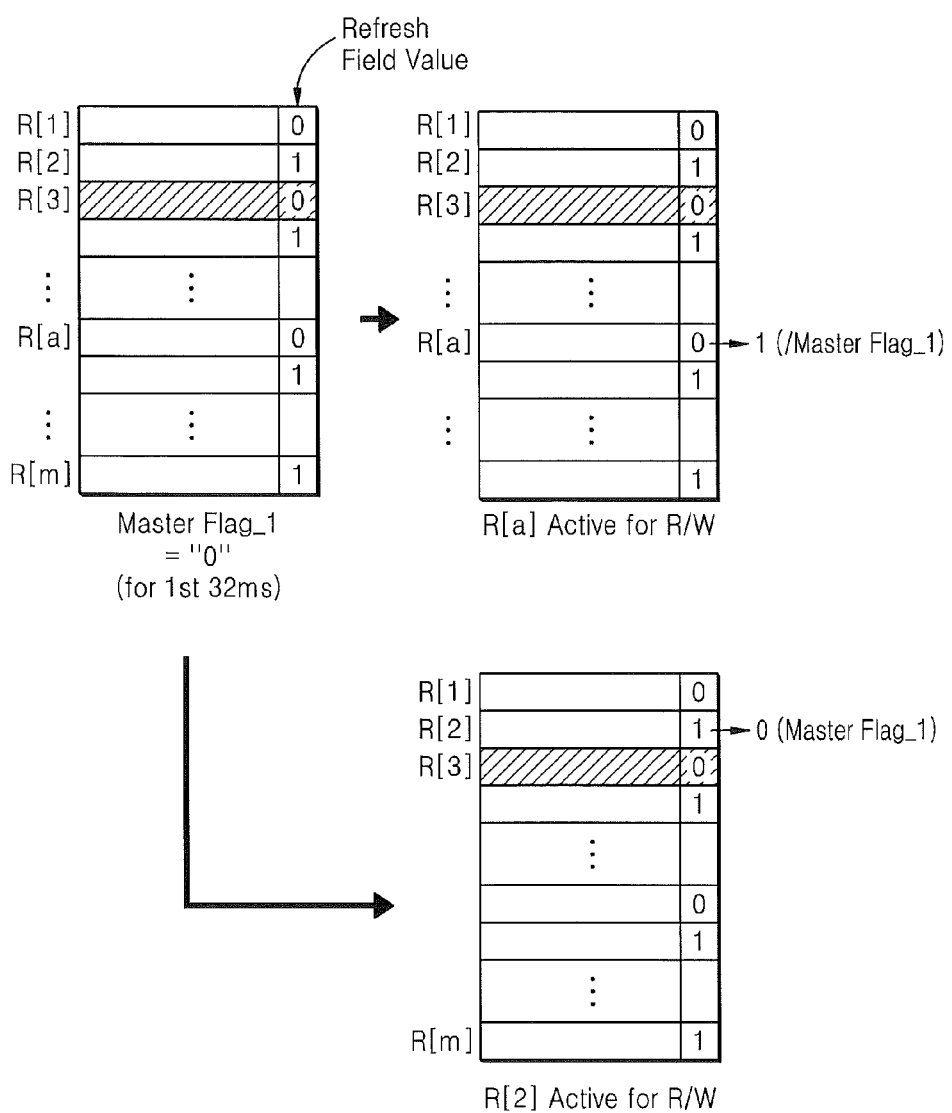

FIG. 8 is a diagram showing refresh operations using refresh field values and master time interval flags in some embodiments to the inventive concept. The refresh field values of each of the m storage regions R[1] through R[m] is set to "0" or "1", and the first master time interval flag Master Flag_1 switches from "0" and "1" for the second half of the refresh time interval. In FIG. 8, for a refresh period of 64 ms, the first master flag time interval Master Flag_1 is set to "0" for the first 32 ms. The refresh field value for page 3 (requested for refresh) and the first master time interval flag Master Flag_1 are compared. The requested refresh of page 3 is performed because the refresh field value for page 3 ("0") and the first master time interval flag Master Flag_1 ("0") are equal.

Later during the operations shown in FIG. 8, the ath page is activated for a read or write operation so that the page is essentially refreshed. When the activation of the ath page is detected, the refresh field value for the ath page (R[a]) corresponding to the ath page may be changed from "0" to "1". For example, the refresh field value of the for the ath page may be set to the same value as the current value of the first master time interval flag Master Flag_1 or to an inversion of the current first master time interval flag Master Flag_1.

Whether the refresh field value is changed may be based on whether the activated page precedes or follows the page currently requested for refresh in the sequence of pages scheduled for refresh requests. If the page (e.g., the ath page) activated for the read/write operation is scheduled for a refresh request later during the current refresh time interval designated by the current value of the first master time interval flag Master Flag_1, the refresh field value for the activated page is inverted so that the later scheduled refresh request for the activated page will be skipped later in the current refresh time interval. Moreover, inverting the refresh field value for the activated page can re-schedule the requested refresh to the next portion of the refresh time interval (when the first master time interval flag Master Flag_1 designates the second half of the refresh time interval).

If, as shown in FIG. 8 however, the activated page for the read/write operation was scheduled for a refresh request earlier in the current portion of the refresh time interval designated by the first master time interval flag Master Flag_1, but was skipped based on the comparison to the first master time interval flag Master Flag_1, the refresh field value for the activated page is inverted.

In this way, a time interval between applications of the refresh commands to the ath page increases, by avoiding unnecessary refresh operations to the ath page, thereby allowing a reduction in power consumption. That is, when the ath page is activated for the read/write operation, the subsequently scheduled refresh operation for the ath page may be skipped due to the recent activation of the page for the read/write operations, thereby increasing the refresh time interval between the previous refresh command and the next refresh command for the ath page. For example, a time interval in a range from 32 ms to 64 ms may be increased according to an address of the ath page, such that a time interval between the previous refresh command and the next refresh command for the ath page may be in a range from 96 ms to 128 ms. It will be understood that the activation of the ath page can therefore supplant the refresh operation which would have otherwise been performed, but was recognized as being redundant and therefore avoided in some embodiments according to the inventive concept.

Figure 9:
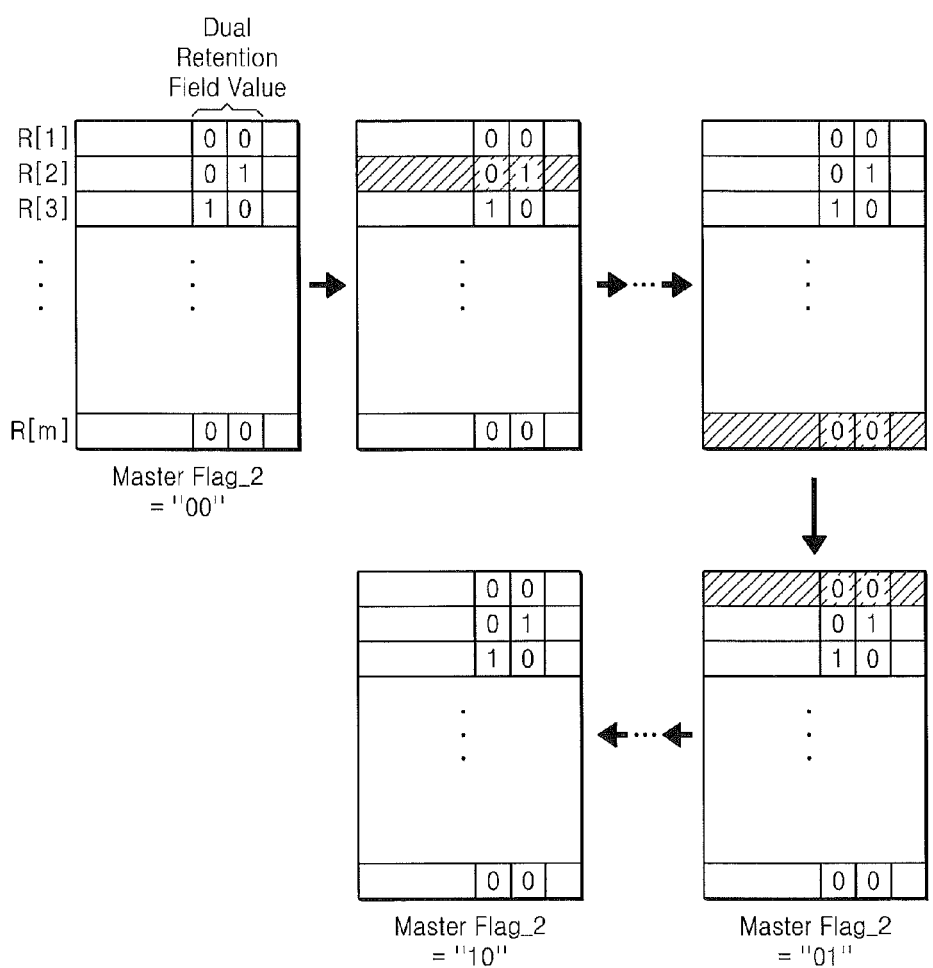

FIG. 9 is a diagram showing a third example of a state of a field value according to the refresh operation. In FIG. 9, the storage circuit stores dual retention field values, and by referring to the dual retention field values for different pages, the refresh operation for different pages maybe controlled separately.

As shown in FIG. 9, each of the m storage regions R[1] through R[m] includes the dual retention field values which can be a buffer of a plurality of bits. The refresh feature of the DRAM may express different refresh features from page to page. Accordingly, some pages of the memory cell array should be refreshed at a refresh time interval of 64 ms, whereas other pages may be refreshed using a refresh time interval of 32 ms or 128 ms, and other values. In particular, cells in some pages may be "weak" due to relatively high charge leakage thereby calling for more frequent refresh, whereas cells in other pages may be "strong" thereby calling for less frequent refresh. Therefore, in some embodiments according to the inventive concept, memory device operational parameters can specify different refresh time intervals on a page-by-page basis to affect refresh operations of the DRAM differently.

The dual retention field values store information related to the refresh time interval of each page, and for example, stores "0" for a page having a refresh period of 64 ms and stores "1" for a page having a refresh period of 128 ms. When the dual retention field includes a 2-bit buffer, the refresh period may be divided into three or more sections and one of "00", "01", "10", and "11" may be stored as a dual retention field values according to a refresh feature of each page. The dual retention field values may be set through an initial test at power-up, or may be updated by periodically conducting a tests during memory operation. Related information in a DRAM chip may be stored by a method such as an anti-fuse method and corresponding information may be read for the setting.

When the basic period of the refresh operation is set to 32 ms, the refresh scheduler 1120 performs a field value comparison every 32 ms by clock counting. For example, for a refresh period of 32 ms, the dual retention field value may be set to "00", and for a refresh time interval of 64 ms, the dual retention field value may be set to "01". For a refresh time interval of 128 ms, the dual retention field value may be set to "10", and so on. Accordingly, the dual retention field value may specify one of a plurality of different refresh time intervals to affect the refresh operation of the particular page. The second master time interval flag Master Field_2 (to be compared with the dual retention field value) is set in the refresh scheduler 1120, and for example, the second master time interval flag Master Flag_2 is changed to "00", "01", "10", or "11" every 32 ms.

Once the refresh scheduler 1120 generates a row address of a page to be refreshed, the dual retention field value in the storage circuit corresponding to the page is referred to. For a page having a dual retention field value of "00", the refresh operation with respect to the page is performed at all times regardless of the second master time interval flag Master Flag_2. For the second master time interval flag Master Flag_2 of "01" or "11", a page having the dual retention field value of "00" is refreshed and in addition, the least significant bit (LSB) of the second master time interval flag Master Flag_2 is compared with the LSB of the dual retention field and a page for which the LSB of the second master flag Master Flag_2 is the same as the LSB of the dual retention field is also refreshed.

As described above, in some embodiments according to the inventive concept, a requested refresh operation for a particular page can be performed responsive to a comparison of the dual retention field values for that page to the master time interval flags that indicate a current portion of a low-frequency refresh time interval. The low-frequency refresh time interval can be, for example, a refresh time interval of 128 ms, whereas a high-frequency refresh time interval can be 32 ms. Accordingly, when a refresh is requested for a page having a dual retention field values indicating a highest-frequency refresh time interval for that page, that is less than the low-frequency refresh time interval, the requested refresh is performed. In contrast, in some embodiments according to the inventive concept, the requested refresh operation is performed when the dual retention field values for that page match the master time interval flags and the requested refresh operation is not performed when the dual retention field values for that page do not match the master time interval flags. In some embodiments according to the inventive concept, the requested refresh operation is performed when a least significant bit of the dual retention field values for that page matches a least significant bit of the master time interval flags and the requested refresh operation is not performed when the least significant bit of the dual retention field values for that page does not match the least significant bit of the master time interval flags. Accordingly, the refresh time interval can be different for different pages. In some embodiments according to the inventive concept, the requested refresh operation is performed when all bits of the dual retention field values for that page match all bits of the master time interval flags and the requested refresh operation is not performed when all bit of the dual retention field values for that page do not match all bits of the master time interval flags. Accordingly, different refresh time intervals can be used for different pages.

Although the refresh field value and the dual retention field value are separately described in FIGS. 8 and 9, both the refresh field value and the dual retention field value may be referred to for the refresh operation with respect to a corresponding page according to an exemplary embodiment of the inventive concept. For example, even if a predetermined page is a target of a refresh operation because that page is not activated for a read/write operation, the page may not be refreshed due to the dual retention field value if the refresh time interval for that page is longer than that portion of the refresh time interval that has elapsed.

Meanwhile, in relation to the inventive concept, policies other than those related to the refresh operation may be used in a memory module or a memory system, and these various policies may also be applied to the above-described embodiments according to the inventive concept. In this regard, a description will be made with the following embodiments. Integrated management of various policies according to the inventive concept is applicable to memory modules in other forms, for example, a SIMM (Single in-line memory module), a DIMM (Dual in-line memory module), an SO-DIMM (Small-outline DIMM), a UDIMM (Unbuffered DIMM), an FBDIMM (Fully-buffered DIMM), an RBDIMM (Rank-buffered DIMM), an LRDIMM (Load-reduced DIMM), a mini-DIMM, and a micro-DIMM. Hereinafter, a description will be made of examples of memory modules in other forms and other policies for memory driving according to the inventive concept.

It will be understood that embodiments according to the inventive concept, can be implemented as part of any standard or non-standardized form factor memory module. For example, some embodiments according to the inventive concept can be provided as part of a single in-line memory module (SIMM), which is a type of memory module that contains random access memory. The SIMM provides duplicate pins replicated on both sides of the module connector, as set out in the JEDEC JESD-21C standard.

Some embodiments according to the inventive concept can also be provided as part of a dual in-line memory module (DIMM). The SIMM provides different pins on both sides of the module connector, as set out in the JEDEC JESD-21C standard.

Some embodiments according to the inventive concept can also be provided as part of a small outline dual in-line memory module (SO-DIMM). The SO-DIMM provides duplicate pins replicated on both sides of the module connector (similar to the DIMM), however, in a smaller form factor compared to that of the DIMM. For example, the SO-DIMM form factor can be about one half of the DIMM. The SO-DIMM can also be characterized by the inclusion of a slot in the connector, which is used as a key to identify different applications for the SO-DIMM. The SO-DIMM form factor can be implemented as set out in the JEDEC JESD-21C standard.

Some embodiments according to the inventive concept can also be provided as part of an unbuffered dual in-line memory module (UDIMM). The UDIMM provides duplicate pins replicated on both sides of the module connector (similar to the DIMM and SO-DIMM). The UDIMM form factor can, however, provide an interface to the memory controller, which is unbuffered. For example, the UDIMM form factor can present every DRAM on the module as a distinct load to the memory controller. The UDIMM form factor can be implemented as set out in the JEDEC JESD-21C standard.

Some embodiments according to the inventive concept can also be provided as part of a fully buffered dual in-line memory module (FBDIMM). The FBDIMM form factor can include a buffer on the module (such as an Advanced Memory Buffer) which buffers the memory controller from the individual DRAMs on the module. Furthermore, multiple FBDIMMs can be coupled together, such that communication from the memory controller is passed from one FBDIMM to another. The FBDIMM form factor can be implemented as set out in the JEDEC JESD205 standard.

Some embodiments according to the inventive concept can also be provided as part of a rank-buffered dual in-line memory module (RBDIMM). The RBDIMM form factor can allow the memory controller to take advantage of existing chip select signals included in DRAMs, to control accesses within a particular RBDIMM on a rank-by-rank basis. The RBDIMM form factor can be implemented as set out in the corresponding JEDEC standard.

Some embodiments according to the inventive concept can also be provided as part of a load reduced dual in-line memory module (LRDIMM). The LRDIMM form factor is configured to receive command and clock signals from a memory controller, and distribute control signals, as well as the addresses the DRAMs on the module based on the command and clock signals received from the memory controller. Further, the data received from the memory controller is buffered and redistributed to each of the DRAMs. Moreover, the buffer also buffers data received from each of the DRAMs, which in turn is provided to the memory controller. The LRDIMM form factor can be implemented as set out in the JEDEC JESD-21C standard.

Some embodiments according to the inventive concept can also be provided as part of a mini-dual in-line memory module (Mini-DIMM). The Mini-DIMM form factor can provide the basic function of, for example, a registered DIMM, but in a smaller form factor. The Mini-DIMM form factor can be implemented as set out in the JEDEC JESD-21C standard.

Some embodiments according to the inventive concept can also be provided as part of a micro-dual in-line memory module (Micro-DIMM). The Micro-DIMM form factor can provide the basic function of, for example, a registered DIMM, but in yet even a smaller form factor compared to the Mini-DIMM. The Micro-DIMM form factor can be implemented as set out in the JEDEC JESD-21C standard.

Figure 10A:
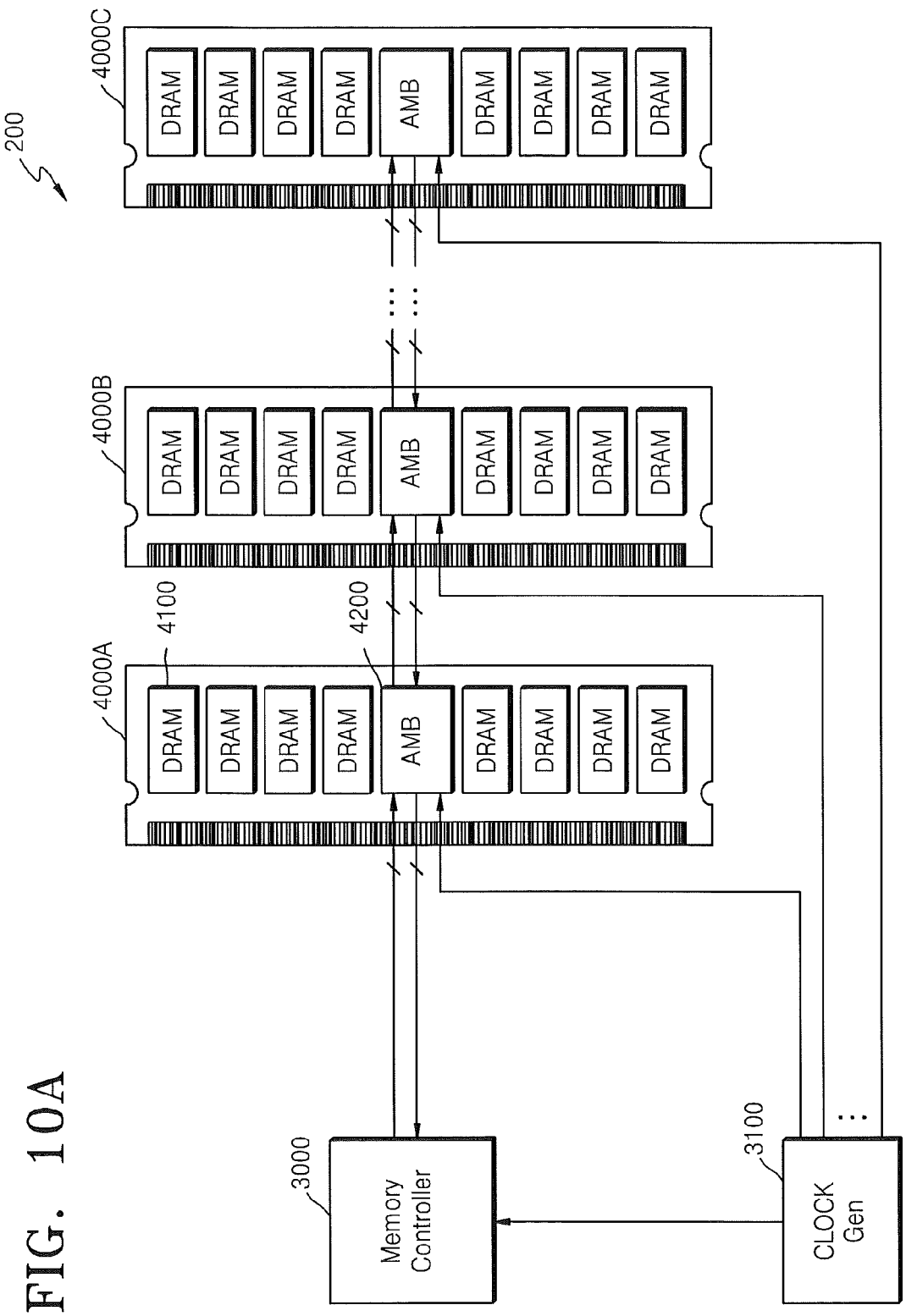
FIGS. 10A and 10B are block diagrams of a memory module and a memory system according to another exemplary embodiment of the inventive concept.
Figure 10B:
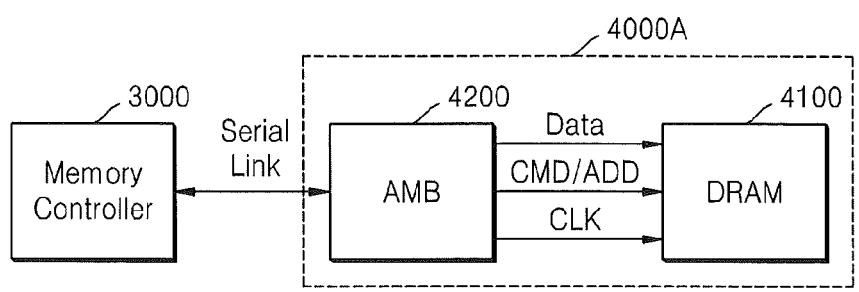

FIGS. 10A and 10B are block diagrams of first through third memory modules 4000A through 4000C and a memory system 200 according to another exemplary embodiment of the inventive concept. As shown in FIG. 10A, each of the first through third memory modules 4000A through 4000C according to an embodiment of the inventive concept may include one or more devices (e.g., DRAMs) 4100. A memory system 200 may include a memory controller 3000 and the memory modules 4000A through 4000C, each of which has the device 4100 mounted therein. The memory system 200 may further include a clock generator 3100, and a clock signal generated from the clock generator 3100 may be provided to the memory controller 3000 or each memory module 4000A through 4000C.

Each memory module 4000A through 4000C shown in FIG. 10A is an FBDIMM, and includes an advanced memory buffer (AMB) 4200. Each FBDIMM communicates with the memory controller 3000, and the memory controller 3000 and the AMB 4200 in each module are connected in a point-to-point manner. The AMB 4200 included in a memory module and the AMB 4200 included in another memory module may transmit and receive packets therebetween. According to this scheme, the number of memory modules connected to the memory system 200 may be increased, thereby achieving high volume and allowing a high-speed operation because the FBDIMM uses a packet protocol.

FIG. 10B is a block diagram of an example of a communication scheme of the memory system 200 shown in FIG. 10A. In FIG. 10B, the memory controller 3000 and the first memory module 4000A are shown for convenience' sake. As shown in FIG. 10B, the memory controller 3000 and the AMB 4200 of the first memory module 4000A transmit and receive packets according to a serial communication scheme, and the AMB 4200 of the first memory module 4000A transmits a packet to and receives a packet from the AMB 4200 of an adjacent memory module (for example, the AMB 4200 of the second memory module 4000B). The address ADD, the command CMD, the clock signal CLK, and the data Data included in the packet is provided to the device 4100 (e.g., the DRAM).

The memory module and the memory system according to the inventive concept as described above will be described below with reference to a single memory module (for example, the first memory module 4000A).

Figure 11:
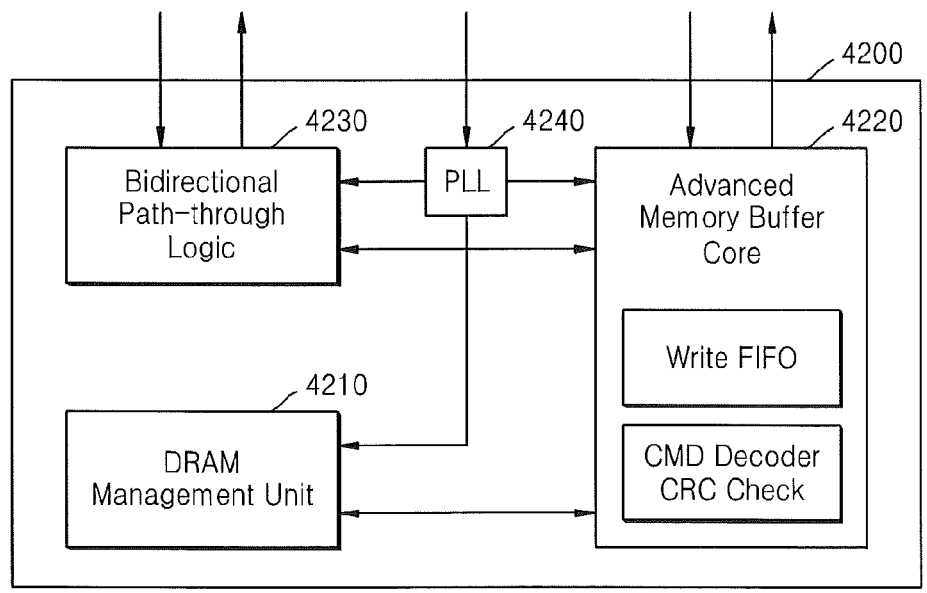
FIG. 11 is a block diagram of an exemplary implementation of an AMB shown in FIG. 10A according to another exemplary embodiment of the inventive concept.

FIG. 11 is a block diagram of an exemplary implementation of the AMB 4200 shown in FIG. 10A. As shown in FIG. 11, the AMB 4200 may include a phase locked loop (4240) for receiving an external clock signal to generate a clock signal used in the AMB 4200, an AMB core 4220 for writing a packet received from outside, decoding the command CMD, or performing cyclic redundancy check (CRC) for checking damage of the packet, and a bidirectional path-through control logic 4230 for controlling bidirectional forwarding of the packet. In particular, the AMB 4200 may further include a DRAM management unit 4210 to which various policies according to embodiments of the inventive concept may be applied to perform integrated management for a memory.

Figure 12:
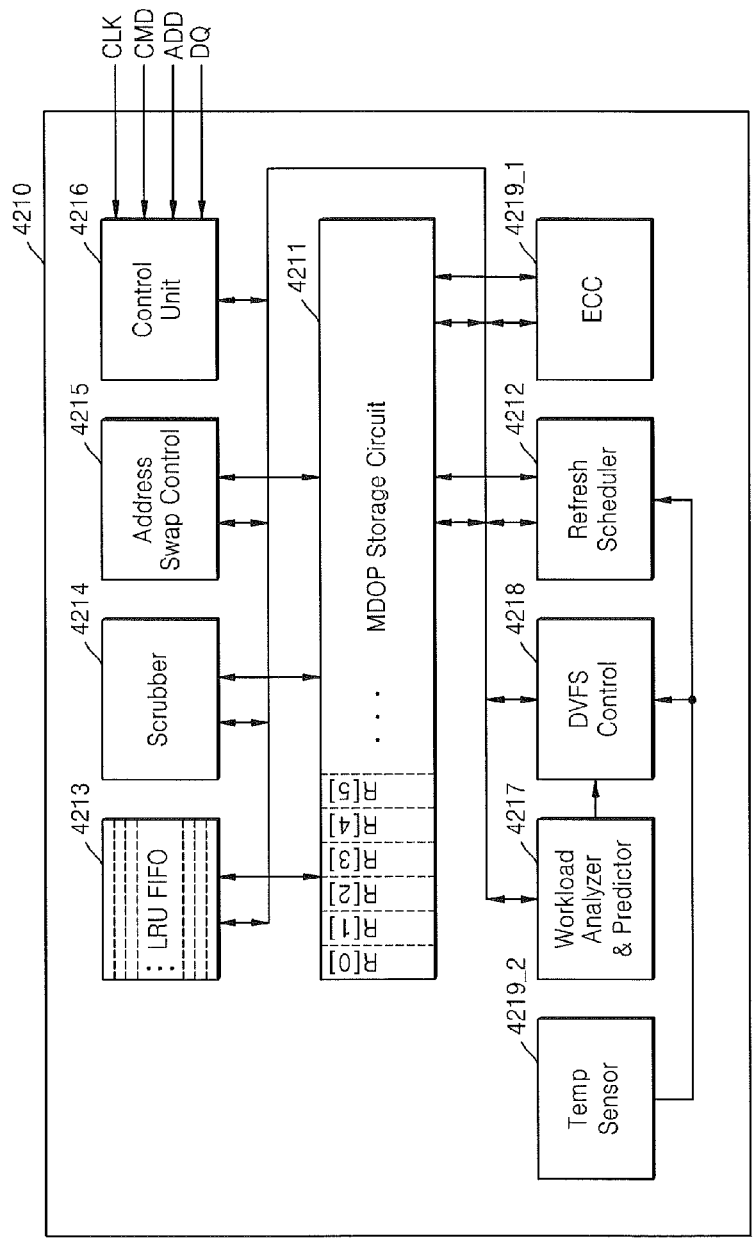
FIG. 12 is a block diagram of an exemplary implementation of a memory management unit shown in FIG. 11 according to another exemplary embodiment of the inventive concept.

FIG. 12 is a block diagram of an exemplary implementation of the DRAM management unit 4210 shown in FIG. 11. As shown in FIG. 12, the DRAM management unit 4210 may include a memory device operational parameter storage circuit 4211 for storing memory device operational parameters and a refresh scheduler 4212 for managing the refresh operations with respect to the memory. The DRAM management unit 4210 may include a control unit 4216 for receiving the clock signal CLK, the command CMD, the address ADD, and the data DQ from outside or from the AMB core 4220 and processing them, a least recently used (LRU)/first-in-first-out (FIFO) unit 4213 for storing information of a predetermined number of addresses of the memory, a scrubber 4214 for reading a memory cell to monitor whether there is a bit error in data stored in the memory, and an address swap control unit 5215 for replacing an error page with a redundant page if an error which cannot be corrected occurs in that page of the memory. The DRAM management unit 4210 may further include a workload analyzer/predictor 4217 for analyzing and predicting a workload of an application (e.g., a computer system) in which the memory system is used, a dynamic voltage frequency scaling (DVFS) control unit 4218 for controlling an operating voltage related to the read/write operations with respect to the memory, an error checking and correction (ECC) unit 4219_1 for performing error detection and correction for data, and a temperature sensor 4219_2 for sensing an ambient temperature and generating temperature information.

Figure 13A:
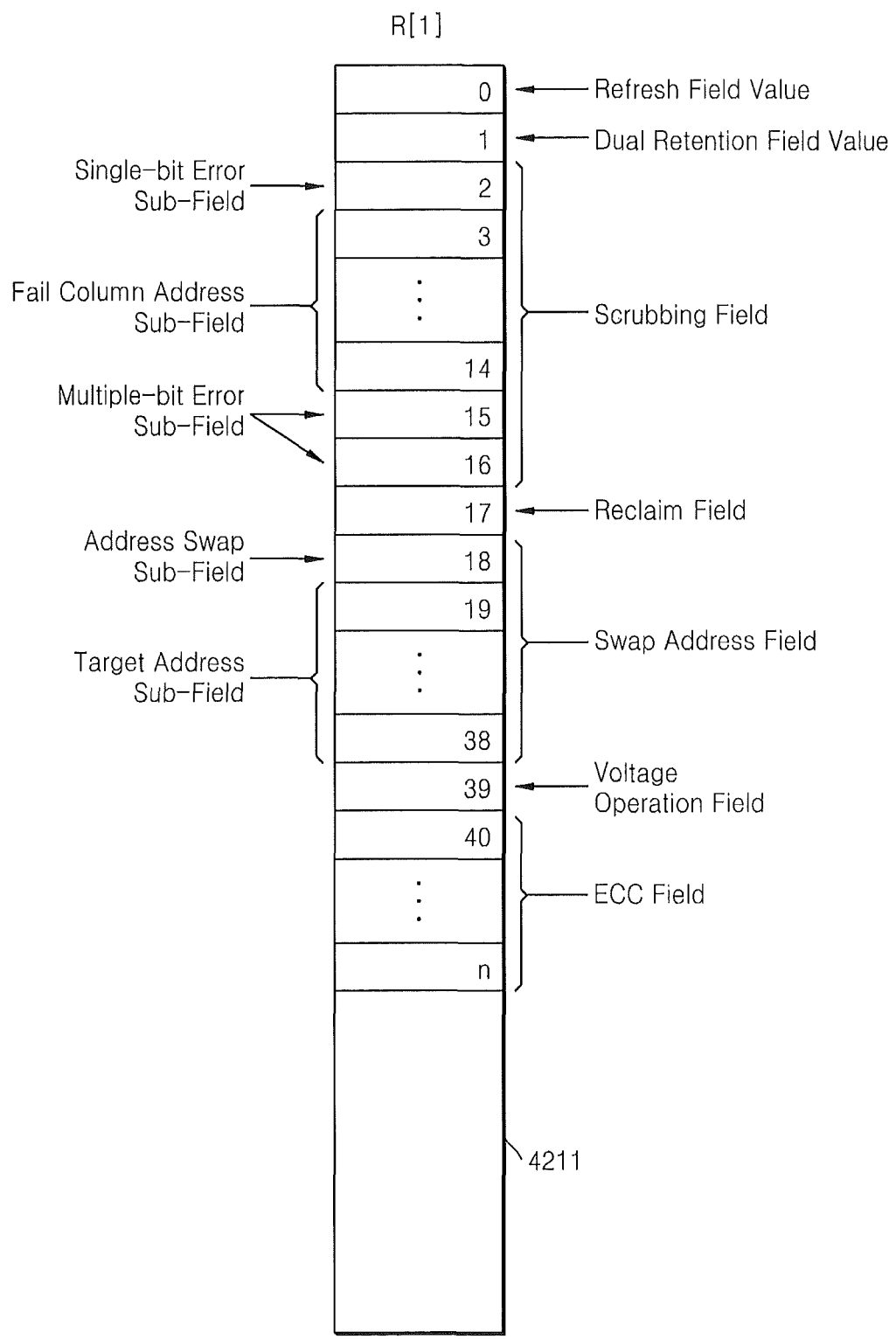
FIGS. 13A, 13B, 13C, and 13D show exemplary implementations of components included in the memory management unit shown in FIG. 12 according to another exemplary embodiment of the inventive concept.

FIGS. 13A through 13D show exemplary implementations of components included in the memory management unit 4210 shown in FIG. 12 according to another exemplary embodiment of the inventive concept. FIG. 13A shows an exemplary implementation of memory device operational parameter storage circuit 4211 shown in FIG. 12. The storage circuit 4211 may be implemented as a register in which m first through mth storage regions R[1] through R[m] are allocated for m pages on a memory module as shown in FIG. 4. In FIG. 13A, one of the storage regions, e.g., the first storage region R[1], is shown as an example, and the first storage region R[1]

includes a buffer of a predetermined size and is composed of a plurality of fields. In FIG. 13A, numbers shown in the first storage region R[1] indicate bit orders of the buffer.

The first storage region R[1] may include a refresh field value related to execution of the refresh operation that stores refresh field values, the dual retention field storing dual retention field values related to the refresh time intervals, a scrubbing field related to a scrubbing operation, a reclaim field related to reclaiming of data stored in the memory, a swap address field related to address swap of an error page, a voltage operation field related to voltages of the read/write operations with respect to the memory, and an ECC field related to ECC. The scrubbing field may include a sub-field having information related to a single-bit error(s), a sub-field having address information of a fail column, and a sub-field having information indicating whether a multi-bit error occurs in a page. The swap address field may include a sub-field indicating whether an error which cannot be corrected occurs in a page corresponding to a predetermined address, and a sub-field having address information of a redundant page. With reference to FIGS. 12 and 13A, a description will be made of operations of a memory module and a semiconductor memory system structured as described above according to another exemplary embodiment of the inventive concept.

To monitor whether a single-bit error occurs in a memory (e.g., the device 4100 shown in FIG. 10A), the scrubber 4214 periodically performs a scrubbing operation by reading the memory. The scrubber 4214 of the memory management unit 4210 performs a scrubbing operation on each page of the memory cell array, and upon occurrence of a single-bit error resulting from the scrubbing operation, stores the result in the scrubbing field of the memory device operational parameter storage circuit 4211. For example, if the single-bit error sub-field is composed of a buffer of 1 bit and a single-bit error occurs in the first page, the single-bit error sub-field of the scrubbing field of the first storing region R[1] has a value of "1".

Other information resulting from the scrubbing operation with respect to each page of the memory cell array is stored in the scrubbing field of the memory device operational parameter storage circuit 4211. For example, the fail column address sub-field is composed of a buffer of 12 bits, and a column address in which the single-bit error occurs is stored in the fail column address sub-field. If two or more errors are detected in a page, information indicating so is stored in a scrubbing field of a storing region corresponding to that page. For example, when a multi-bit error sub-field of a scrubbing field is composed of a buffer of 3 bits, in case of occurrence of a 2-bit failure, "001" is stored in the multi-bit error sub-field and in case of occurrence of a 3-bit failure, "010" is stored in the multi-bit error sub-field. In this way, in case of occurrence of a failure of other numbers of bits, information indicating so is stored in the multi-bit error sub-field. If a failure of 8 bits or more occurs, "111" is stored in the multi-bit error sub-field.

To perform the scrubbing operation, the scrubber 4214 refers to a value of the scrubbing field stored in the memory device operational parameter storage circuit 4211 and performs the scrubbing operation with respect to the memory cell array based on the referred value. For example, the scrubber 4214 sequentially scrubs a plurality of pages, and refers to a value of the scrubbing field of the memory device operational parameter storage circuit 4211 before performing the scrubbing operation with respect to each page. For a single-bit error sub-field of "0", the scrubber 4214 does not perform the scrubbing operation with respect to a corresponding page; for a single-bit error sub-field of "1", the scrubber 4214 performs the scrubbing operation with respect to a corresponding page. The fail column address sub-field is referred to for the scrubbing operation, such that when a page is scrubbed, an address is read from a corresponding fail column address sub-field and the scrubbing operation with respect to the page is performed using the read address as a start address.

When two or more failures occur in a page, for error correction of data, an ECC resource (e.g., an ECC parity) of more bits is used. In a normal write operation, a value of the multi-bit error sub-field of the scrubbing field is referred to and an ECC parity is further generated according to the reference result for error correction of data. For example, for a multi-bit error sub-field of "000", an ECC of 1 bit is used; for a multi-bit error sub-field of "011", an ECC of 4 bits are used. The ECC unit 4219_1 shown in FIG. 12 generates an ECC parity for error correction of data by referring to the value of the multi-bit error sub-field. As described above, different bit numbers of an ECC parity is generated according to the value of the multi-bit error sub-field, and the generated ECC parity is stored in the ECC field of the memory device operational parameter storage circuit 4211. To read data stored in the memory cell array, the original data may be determined using the data stored in the memory and an ECC parity stored in the ECC field.

Meanwhile, in a computer system where a memory, e.g., a DRAM, is used, if a central processing unit (CPU) requests a memory resource, previously stored data is removed in case of absence of an empty space in the memory, and a reclaiming operation for using a corresponding space provided by the removal for another purpose has to be performed. During the reclaiming operation, if data of a page of the memory cell array is the same as the original data present in a non-volatile storage device, e.g., a hard disk drive (HDD), the data of that page may be directly removed, but if the data is different from the original data (or the data of the page is dirty data), the corresponding space has to be used for another purpose after the data is moved to the HDD.

To manage the reclaiming operation, the memory device operational parameter storage circuit 4211 of the memory management unit 4210 of FIG. 12 includes a reclaim field in which information indicating whether each page of the memory cell array includes dirty data may be stored. Thus, when the reclaiming operation is performed, it may be checked from the reclaim field if data of each page needs to be backed up in the HDD, and based on the result, the reclaiming operation is performed. For example, if the data of the HDD is moved to the memory and then a page of the memory is opened for the read and/or write operations, the reclaim field of that page may be changed to "1".

The memory management unit 4210 may include the LRU/FIFO unit 4213 having a predetermined size, and address information of the page having the changed value of the reclaim field is stored in the LRU/FIFO unit 4213. Address information of a predetermined number of pages of the memory cell array (e.g., 30% of total pages of the memory) may be stored based on the order of the recently used page first. For the reclaiming operation, address information stored in the LRU/FIFO unit 4213 is provided to an external memory controller or CPU, and the reclaiming operation may be performed based on the provided address information. For example, the reclaiming operation is performed on pages corresponding to the other addresses than the address provided to the external memory controller or CPU.

If an error which cannot be corrected occurs in a page of the memory, the address swap control unit 4215 of the memory management unit 4210 performs an operation for replacing an error page with a redundant page. To this end, the memory device operational parameter storage circuit 4211 includes a swap address field which may include a first sub-field having address information of a page in which an error occurs and a second sub-field having address information of a redundant page for replacing the error page.

The redundant page is selected by generating an address that is not accessible from outside in a memory device or a memory module. If an error which cannot be corrected occurs in a predetermined page, a value of the first sub-field of the swap address field corresponding to that page is changed, for example, by writing "1" to the first sub-field, information about whether to change the page into another page is included. If a page to be read or written is a target of an address swap, address information of a redundant page stored in the second sub-field is read and the address of the redundant page is provided to the memory.

The DVFS control unit 4218 of the memory management unit 4210 manages information related to an operating voltage of the read/write operations with respect to the memory. To this end, the memory device operational parameter storage circuit 4211 may include a voltage operation field related to the voltages of the read/write operations with respect to the memory. Information related to levels of voltages used in data read/write operations with respect to the memory is stored in the voltage operation field, and such voltage-level-related information is stored page-by-page.

When data is written to the memory, for example, the data is written in a page with a voltage of 1V and then data of that page is read with a voltage of 1.1V, a margin of data "1" may be more vulnerable than a margin of data "0". Thus, information related to levels of operating voltages is stored in the voltage operation field page-by-page, and then at execution of various operations, such as a read operation, a refresh operation, etc., the information stored in the voltage operation field is referred to.

To reduce power consumption in a semiconductor device or a memory module, the workload analyzer/predictor 4217 analyzes a workload and provides the analysis result, such that for a small workload, the DVFS control unit 4218 lowers a voltage level provided to a DRAM cell, for example, a level of an operating voltage of a memory is lowered from 1.1 V to 1.0V. In addition, information related to a voltage level is written in a voltage operation field corresponding to a page operated with a low voltage. For example, when a page is operated with a low voltage, "1" is written to the voltage operation field corresponding to the page. During a subsequent operation, for example, the refresh operation, the refresh scheduler 4212 may refer to the voltage operation field of the memory device operational parameter storage circuit 4211 and control the refresh operation according to the reference result.

The number of bits of the voltage operation field may be determined according to a type of a changeable voltage or the number of changeable voltages. For example, when a voltage level changes at four steps of 1.2V, 1.1V, 1.0V, and 0.9V, the voltage operation field may include a buffer of 2 bits. If the write operation with respect to a page of the memory is performed with a low voltage of 0.9V or 1.0V, the page is first refreshed through the refresh operation performed with a normal voltage. For example, at the time of entry to a normal-voltage mode from a low-voltage mode, the voltage operation field of the memory device operational parameter storage circuit 4211 is scanned and the page operated (written) at a low voltage level is refreshed with a normal voltage. For this end, the refresh operation may include a continuous refresh scheme for continuously refreshing a plurality of pages and a dispersed refresh scheme for refreshing the pages in a dispersed way. Upon start of a refresh period, pages operated with a low voltage are continuously refreshed, and after completion of the refresh operation, values of voltage operation fields corresponding to the pages are changed. Thereafter, for the remaining pages, the refresh operation is performed in the above-described manner. In case of switch from the normal-voltage mode to the low-voltage mode, if a page is opened for an operation such as the write operation, etc., a value of the voltage operation field corresponding to the opened page is changed.

Figure 13B:
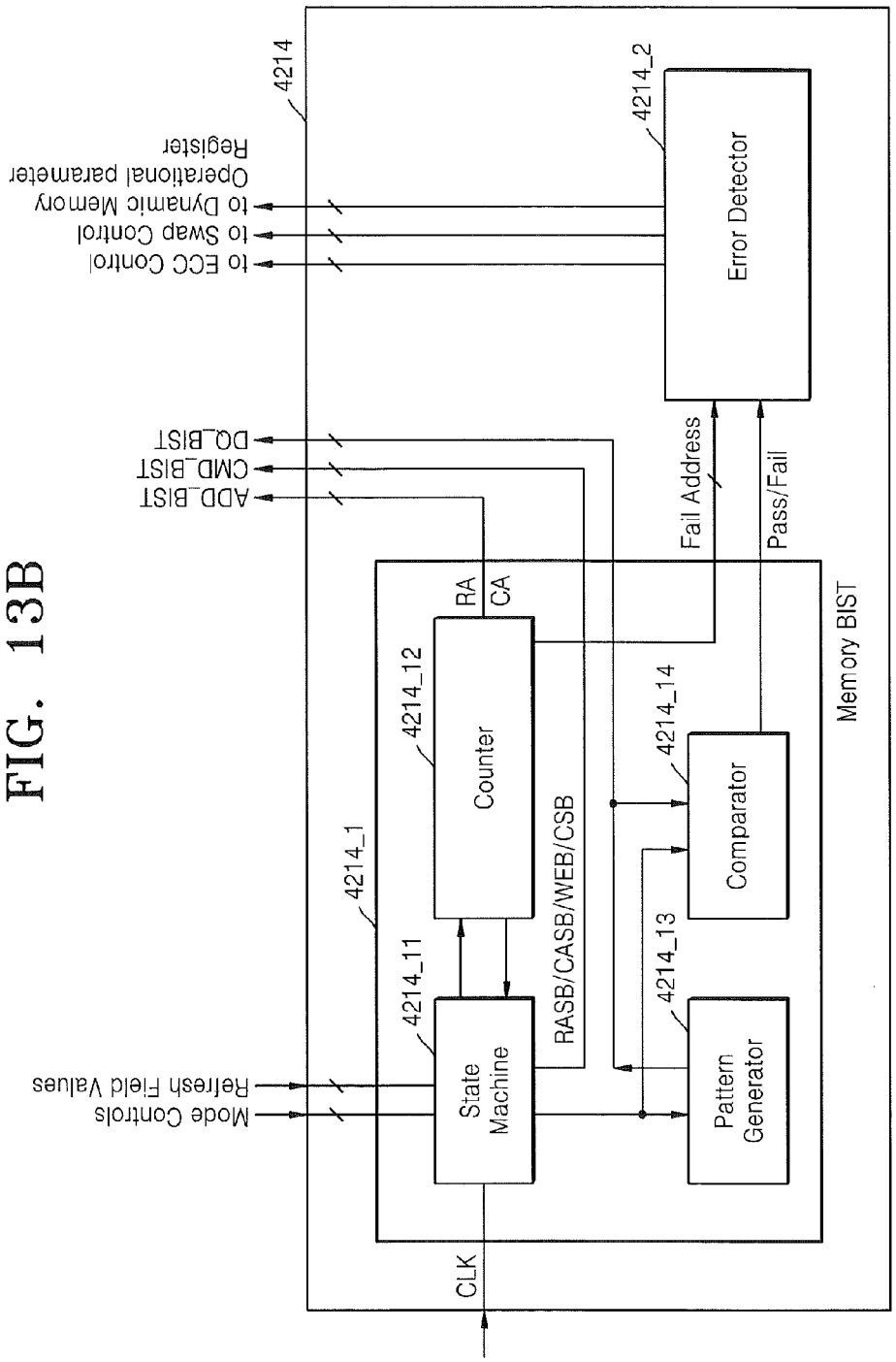

FIG. 13B is a block diagram of an exemplary implementation of the scrubber 4214 shown in FIG. 12. As shown in FIG. 13B, the scrubber 4214 may include a memory BIST unit 4214_1 for monitoring occurrence of an error in the memory cell array and an error detector 4214_2 for performing error detection by using a test result provided from the memory BIST unit 4214_1. The memory BIST unit 4214_1 may include a state machine 4214_11 for generating various commands CMD_BIST for overall controlling of a monitoring operation or a test operation, a counter 4214_12 for generating a test address ADD_BIST for selecting a memory cell, a pattern generator 4214_13 for generating a data pattern DQ_BIST for the test operation, and a comparator 4214_14 for comparing the data pattern DQ_BIST with a pattern read from the memory cell.

The state machine 4214_11 receives mode control signals Mode Controls or field values Field Values to generate the command CMD_BIST and various control signals. For example, in response to the mode control signals Mode Controls, the operation of the scrubber 4214 may switched on/off. The state machine 4214_11 may control address generation of the counter 4214_12 or pattern generation of the pattern generator 4214_13 by referring to the field values Field Values. The data pattern DQ_BIST is stored in the memory cell, and after a predetermined time, the memory cell is read. The comparator 4214_14 provides a result of comparison between the original data pattern DQ_BIST with the pattern read from the memory cell to the error detector 4214_2.

The error detector 4214_2 detects occurrence of a singe-bit error in a page, address information of a column in which the error occurs, and the number of bits of the error occurring in the page, based on the comparison result. The error detector 4214_2 writes information corresponding to the detection result in the scrubbing field. If a multi-bit error occurs in a page, information indicating so is provided to the ECC unit 4219_1 to allow the ECC unit 4219_1 to generate an ECC parity corresponding to the multi-bit error. If a plural-bit error occurs in a predetermined page and thus error correction is not possible, information indicating so may be provided to the address swap control unit 4215.

Figure 13C:
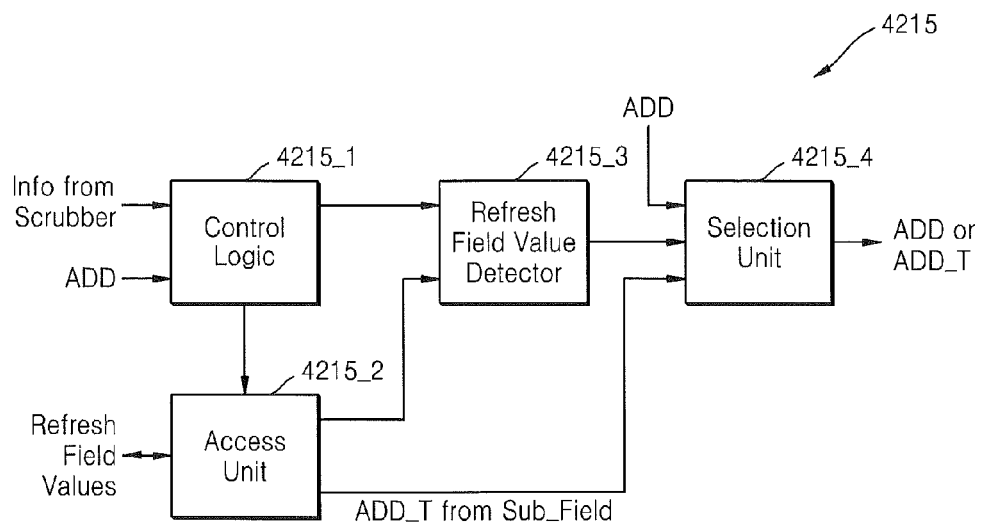

FIG. 13C is a block diagram of an exemplary implementation of the address swap control unit 4215 shown in FIG. 12. As shown in FIG. 13C, the address swap control unit 4215 may include a control logic 4215_1 for overall controlling an address swap operation, an access unit 4215_2 for accessing memory device operational parameter storage circuit 4211 to write or read a field value, a field value detector 4215_3 for detecting a value of the swap address field of a page corresponding to an address, and a selection unit 4215_4 for selectively outputting the original address or a redundant address according to a result of detecting the field value.

The control logic 4215_1 may receive a scrubbing result from the scrubber 4214 shown in FIG. 13B, and set or update the swap address field of the memory device operational parameter storage circuit 4211 in response to the scrubbing result. The control logic 4215_1 controls the access unit 4215_2 in response to the scrubbing result, changes a value of the first sub-field of the swap address field corresponding to a page where an error which cannot be corrected occurs into "1", and writes an address of a redundant page for replacing the page where the error occurs in the second sub-field of the swap address field.

Thereafter, upon receiving the address ADD for the read/write operations with respect to the memory cell array, the control logic 4215_1 controls the access unit 4215_2 to access the value of the swap address field corresponding to the address ADD. The field value detector 4215_3 receives the value of the first sub-field corresponding to the address ADD, detects whether the value of the first sub-field is "1" or "0", and provides the detection result to the selection unit 4215_4. The selection unit 4215_4 outputs the address ADD for the first sub-field of "0", and outputs an address ADD_T of the redundant page, written in the second sub-field of the swap address field, for the first sub-field of "1". Thus, the address swap operation for using the redundant page is performed outside a DRAM chip (e.g., an AMB chip on a module), and the swapped address is provided to the DRAM chip, such that the page in which the error that cannot be corrected is replaced with the redundant page.

Figure 13D:
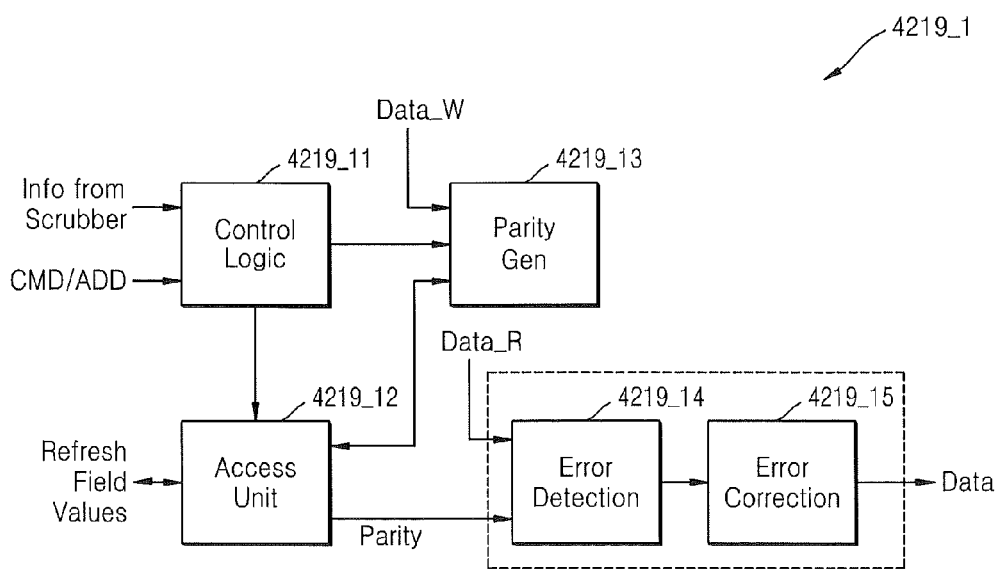

FIG. 13D is a block diagram of an exemplary implementation of the ECC unit 4219_1 shown in FIG. 12. As shown in FIG. 13D, the ECC unit 4219_1 may include a control logic 4219_11 for controlling an overall operation for error correction, an access unit 4219_12 for accessing the memory device operational parameter storage circuit 4211 to write or read a field value related an ECC operation, a parity generator 4219_13 for generating an ECC parity corresponding to write data Data_W by referring to the write data Data_W and a field value of the memory device operational parameter storage circuit 4211, and an ECC decoder for generating error-corrected data Data by using data Data_R read from the memory cell array and the ECC parity. The ECC decoder may include an error detection unit 4219_14 for detecting occurrence of an error from the read data and an error correction unit 4219_15 for performing error correction based on the error detection result.

The control logic 4215_1 may receive the scrubbing result from the scrubber 4214 shown in FIG. 13B, and control the ECC operation by referring to a field value stored in the memory device operational parameter storage circuit 4211, for example, a value of the multi-bit error sub-field. The control logic 4215_1 may generate various control signals for the ECC operation in response to the command CMD related to the read/write operations. The access unit 4219_12 accesses a field value of the memory device operational parameter storage circuit 4211 under the control of the control logic 4215_1, and provides the accessed field value to various circuit blocks in the ECC unit 4219_1 for control of the ECC operation.

For instance, upon application of a write command with respect to a predetermined page, the access unit 4219_12 accesses a value of the multi-bit error sub-field of the memory device operational parameter storage circuit 4211 and provides the accessed sub-field value to the parity generator 4219_13. The parity generator 4219_13 then generates ECC parity having different bit numbers according to the value of the multi-bit error sub-field. Hence, the ECC parity having different bit numbers for different write data Data_W is generated and provided to the access unit 4219_12. The access unit 4219_12 writes the generated ECC parity in the ECC field of the memory device operational parameter storage circuit 4211 corresponding to the page on which the written operation is to be performed.

Upon application of a read command with respect to a predetermined page, the access unit 4219_12 reads ECC parity recorded in the ECC field corresponding to the page and provides the read ECC parity to the ECC decoder. The error detection unit 4219_14 and the error correction unit 4219_15 perform error detection and error correction with respect to the read data Data_R by using the read data Data_R and the ECC parity, and provides the error-corrected data Data to outside.

Figure 14A:
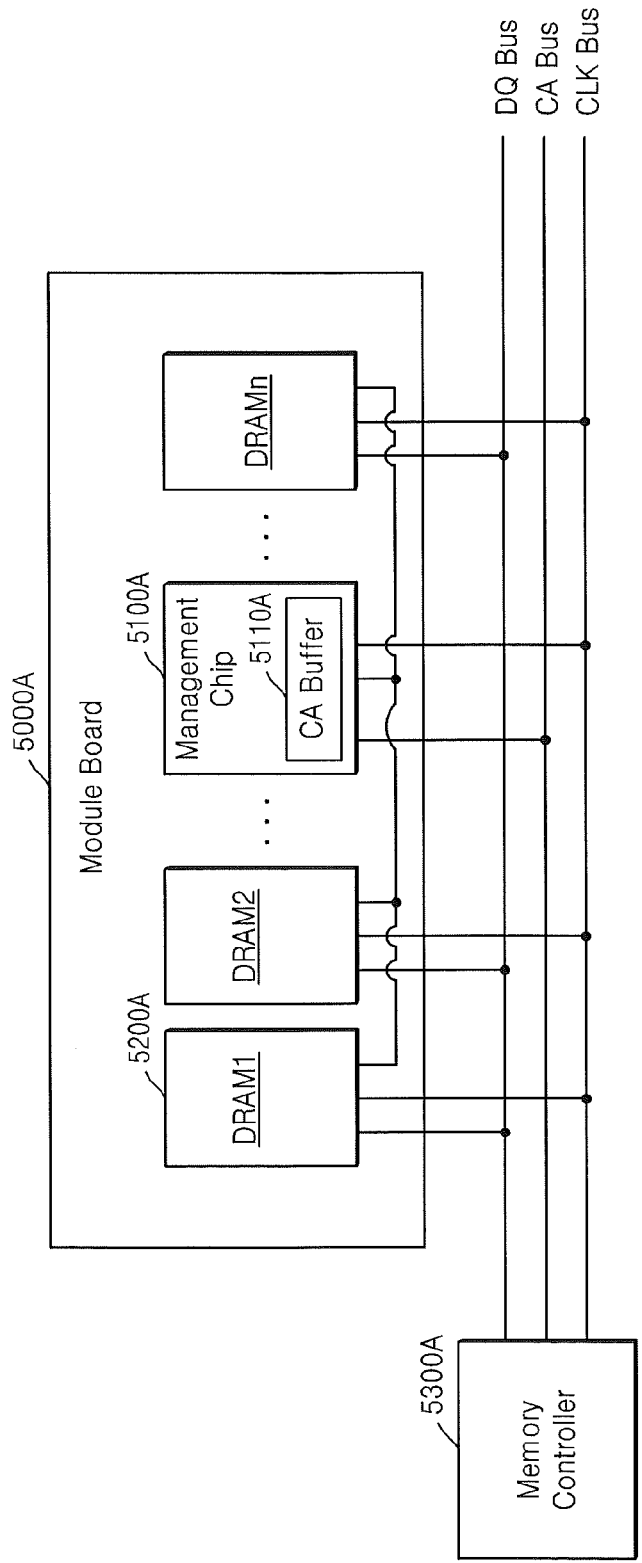
FIGS. 14A and 14B are block diagrams of a memory module according to another exemplary embodiment of the inventive concept.
Figure 14B:
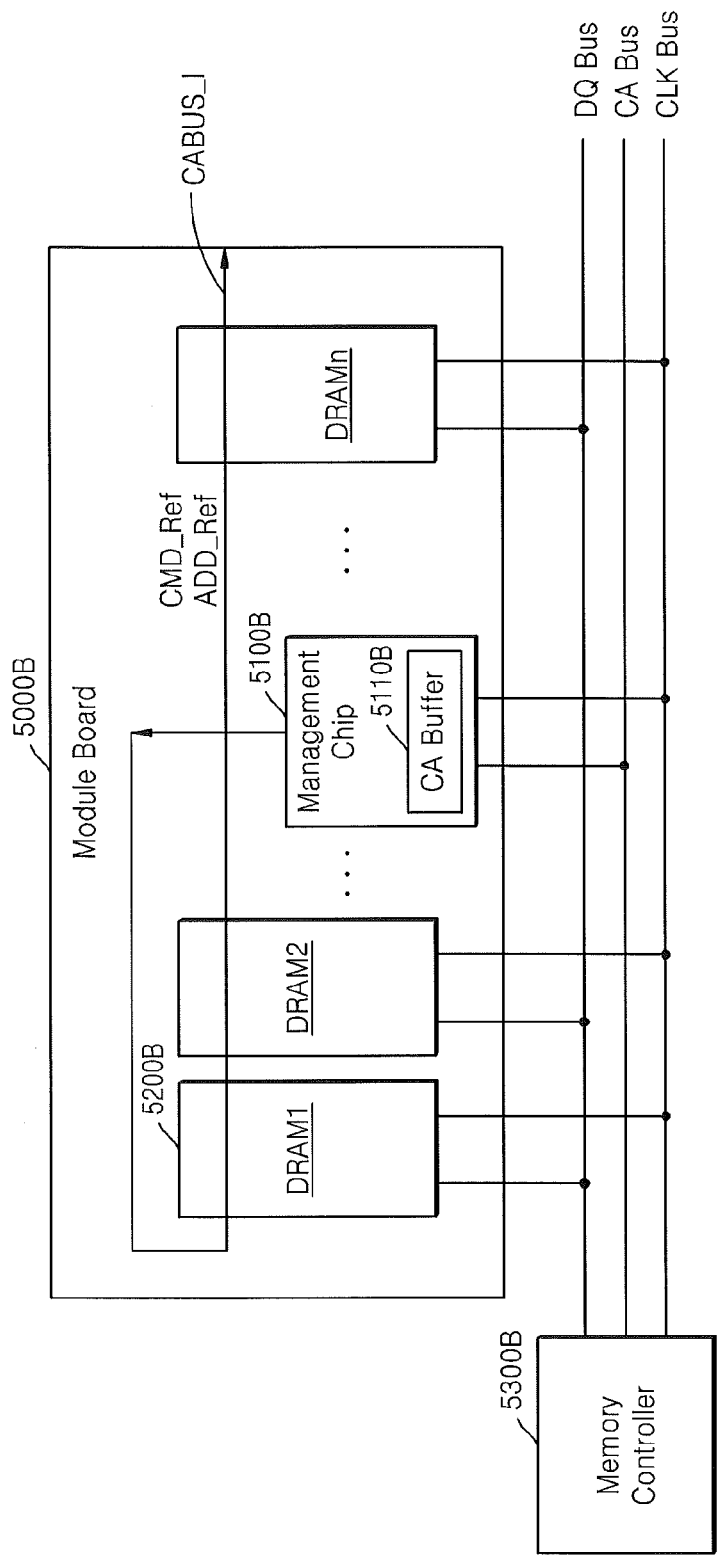

FIGS. 14A and 14B are block diagrams of memory modules 5000A and 5000B according to another exemplary embodiment of the inventive concept. In the previous embodiment, various policies including the refresh operation are applied to the FBDIMM; in the following embodiment, they are applied to a registered dual in-line memory module (RDIMM).

As shown in FIG. 14A, the memory module 5000A may include a DRAM management chip 5100A and one or more devices 5200A mounted on a module board. As the device 5200A, a DRAM including DRAM cells may be used. In FIG. 14A, a memory controller 5300A is further shown, such that the memory controller 5300A and the memory module 5000A may form a memory system. The memory controller 5300A and the memory module 5000A communicate through various system buses, for example, a data bus DQ Bus, a command/address bus CA Bus, and a clock bus CLK Bus. Data and a clock signal from the memory controller 5300A are provided to the devices 5200A through the system bus and buses arranged separately for the respective devices 5200A. Command/address signals are first provided to the memory management chip 5100A, and the memory management chip 5100A then buffers the command/address signals and provides them to the respective devices 5200A.

The DRAM management chip 5100A may include various functional blocks provided in the above-described embodiments. For example, the DRAM management chip 5100A may include a memory device operational parameter storage circuit for storing memory device operational parameter values configured to affect the operations of the devices 5200A, for example, on a region-by-region basis. As described above, a memory cell array includes a plurality of regions and the memory device operational parameter storage circuit can store a memory device operational parameter value for each of the plurality of regions of the memory cell array. For example, a memory device operational parameter value is stored for each page of the memory cell array, as the region. The DRAM management chip 5100A may include various functional blocks such as a refresh scheduler, an LRU/FIFO unit, a scrubber, etc., to manage the refresh operation with respect to the memory cell array.

The DRAM management chip 5100A includes a command/address buffer 5110A for storing command/address signals transmitted through the system bus, e.g., the command/address bus CA Bus. The command/address signals from the command/address buffer 5110A are provided to the devices 5200A, or the command/address signals may be processed in the DRAM management chip 5100A and the processed command/address signals are provided to the devices 5200A. For example, the DRAM management chip 5100A buffers external command/address signals for the read/write operations and provides them to the semiconductor devices 5200A, or generates the command CMD_Ref and the address ADD_Ref related to the refresh operation and provides them to the devices 5200A. The command/address signals are provided to the devices 5200A through an internal bus CABUS_I disposed on the module board.

FIG. 14B shows another implementation of the memory module 5000A shown in FIG. 14A. The memory module 5000B shown in FIG. 14B also includes a DRAM management chip 5100B and one or more devices 5200B mounted on a module board. The memory module 5000B communicates with a memory controller 5300B through system buses DQ Bus, CA Bus, and CLK Bus. The DRAM management chip 5100B may include various functional blocks provided in the foregoing embodiments, and include a command/address buffer 5110B for storing command/address signals transmitted through the system bus. FIG. 14B shows the memory module 5000A using the internal bus CABUS_I in a fly-by daisy chain form, such that the internal bus CABUS_I forwards internal command/address signals from a side to another side of the memory module 5000A. For example, the refresh command CMD_Ref and the refresh address ADD_Ref generated in the DRAM management chip 5100A are sequentially forwarded from a first device DRAM1 to an nth device DRAMn.

Figure 15A:
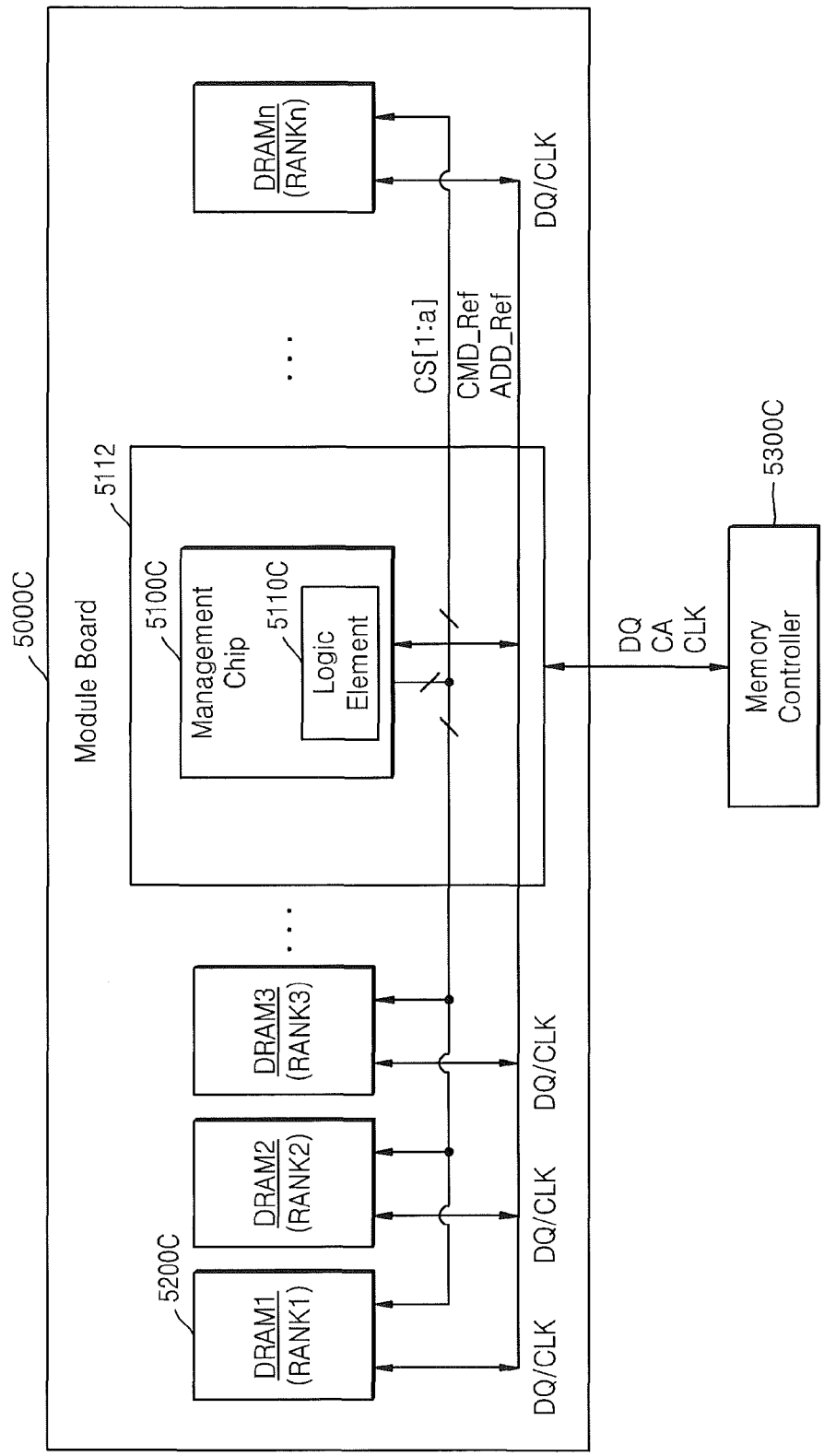
FIGS. 15A and 15B are block diagrams of a memory module according to another exemplary embodiment of the inventive concept.
Figure 15B:
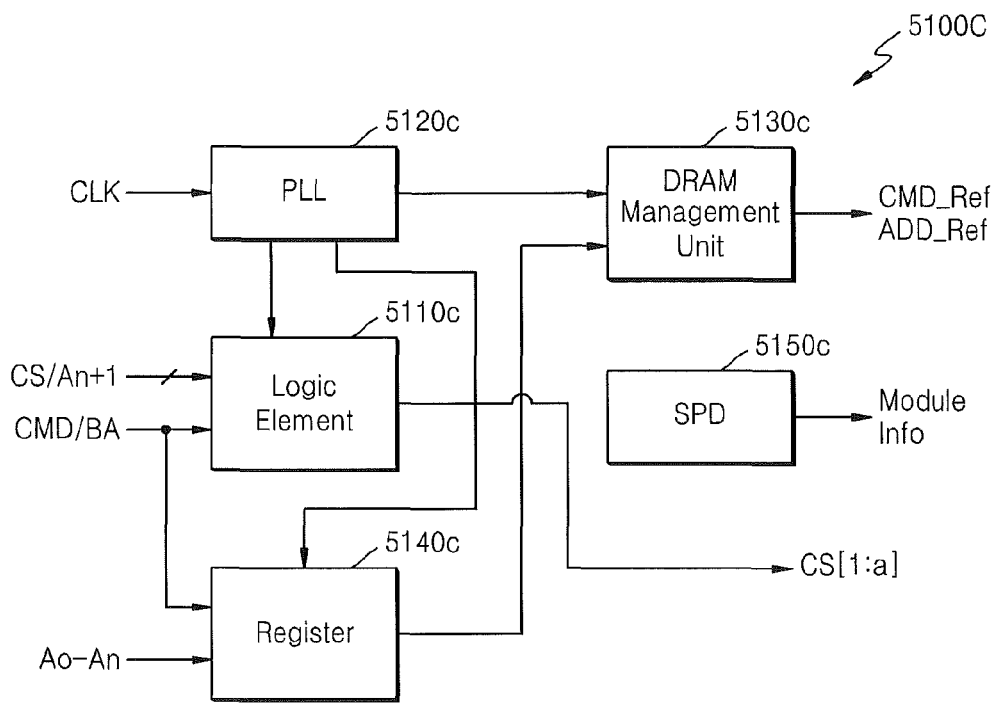

FIGS. 15A and 15B are block diagrams showing a memory module 5000C according to another exemplary embodiment of the inventive concept. In FIGS. 15A and 15B, the embodiment is applied to a memory module in the form of an LRDIMM.

As shown in FIG. 15A, the memory module 5000C may include a memory management chip 5100C and one or more devices 5200C mounted on a module board. A DRAM chip including DRAM cells may be used as the device 5200C, and one or more DRAM chips may be defined as the same rank. In FIG. 15A, each DRAM chip is defined as a rank, such that, for example, a first DRAM chip DRAM1 is defined as a first rank Rank1 and a second DRAM chip DRAM2 is defined as a second rank Rank2. The memory module 5000C communicates with a memory controller 5300C, and data DQ, command/address signals CA, and a clock signal CLK are transmitted and received between the memory module 5000C and the memory controller 5300C.

In the memory module 5000C in the form of an LRDIMM, two or more chips 5200C are grouped as a single logical chip. The memory management chip 5100C includes a logic element 5110C which generates one or more control signals for controlling ranks of the devices 5200C. The logic element 5100 receives command/address signals from the memory controller 5300C and processes the received command/address signals to generate a control signal CS[1:a] for controlling the ranks. The memory management chip 5100C may include various functional blocks provided in the above-described embodiments, such as a memory device operational parameter storage circuit, a refresh scheduler, and so forth. Thus, the memory management chip 5100C generates various signals for controlling the memory, e.g., the refresh command CMD_Ref and the refresh address ADD_Ref for controlling the refresh operation of the devices 5200C, and provides the signals to the devices 5200C.

In some embodiments according to be inventive concept, the LRDIMM formatted module 5003 includes a buffer 5112, which includes the memory management chip 5100C. It will be understood that, although FIG. 15a shows a single buffer 5112, more buffers may be used. The buffer 5112 is configured to receive command and clock signals from the memory controller 5300C, and distribute the control signals CS[1:a] and CMD_Ref, as well as the addresses ADD_Ref to the DRAMs based on the command and clock signals received from the memory controller 5300C. Further, the buffer 5112 buffers the data received from the memory controller 5300C and redistributes the data to each of the DRAMs. The buffer 5112 also buffers data received from each of the DRAMs, which in turn is provided to the memory controller 5300C. Accordingly, the buffer 5112 can reduce the load provided to the memory controller 5300C to provide the LRDIMM form factor module 5000C.

FIG. 15B is a block diagram of an exemplary implementation of the memory management chip 5100C shown in FIG. 15A. As shown in FIG. 15B, the memory management chip 5100C may include a logic element 5110C, a PLL 5120C for generating clock signals used in the memory management chip 5100C and/or the memory module 5000C, a DRAM management unit 5130C where functional blocks related to various policies for managing the devices 5200C are arranged, a register 5140C for storing signals provided from the memory controller 5300C, and a serial-presence detector (SPD) 5150C including a storing element.

The logic element 5100C may receive input commands and addresses CS, CMD, An+1, and BA from the memory controller 5300C, and generates a rank control signal CS[1:a] in response to the input commands and addresses CS, CMD, An+1, and BA. The rank control signal CS[1:a] is generated as many as ranks included in the memory module 5000C, and preferably, the number of rank control signals CS[1:a] is equal to the number of ranks provided in the memory module 5000C. The external memory controller 5300C recognizes that a smaller number of ranks than ranks actually provided in the memory module 5000C are included in the memory module 5000C. For example, the memory module 5000C includes n ranks, and the memory controller 5300C recognizes that n/2 ranks are provided in the memory module 5000C. The logic element 5100 determines selection of a rank according to states of selection signals CS0 and CS1, an upper bit An+1 of an address, and a command CMD, and generates a corresponding rank control signal CS[1:a].

The command CDM and addresses A0-An stored in the register 5140C of the memory management chip 5100C are provided to the DRAM management unit 5130C. The DRAM management unit 5130C includes various functional blocks described in the previous embodiment, including a memory device operational parameter storage circuit, a refresh scheduler, etc. For example, the DRAM management unit 5130C manages an operation according to the command CMD and the address ADD input from outside by referring to information regarding the devices 5200C stored in the memory device operational parameter storage circuit, and periodically generates the refresh command CMD_Ref and the refresh address ADD_Ref according to an operation of a timer related to the refresh operation provided in the DRAM management unit 5130C. The SPD 5150C may include a non-volatile memory, e.g., an electrically erasable programmable read-only memory (EEPROM), and in the SPD 5150C may be written information about the devices 5200C mounted in the memory module 5000C, such as the number of row and column addresses, a data width, the number of ranks, a memory density per rank, the number of memory devices, a memory density per memory device, and so forth), at the time of designing of a memory interface. When the memory system is initialized, information Module_info about the memory module 5000C is provided to the memory controller 5300C from the SPD 5150C.

Figure 16:
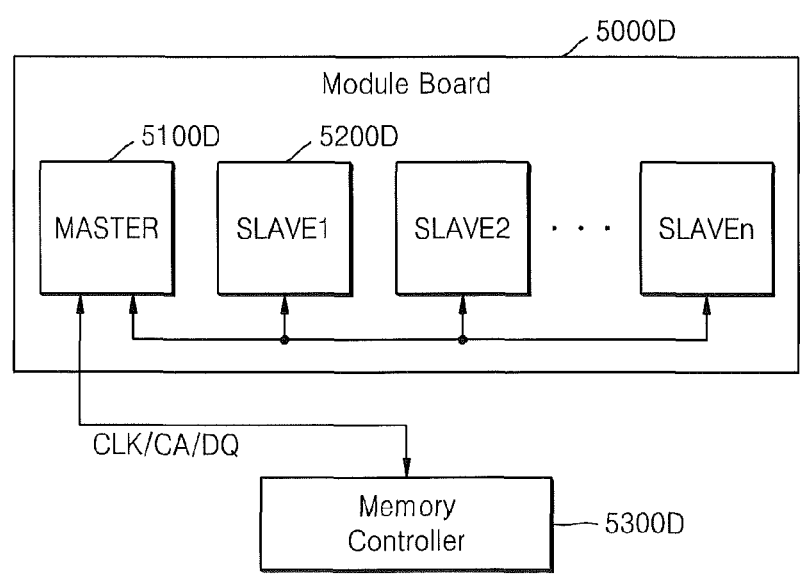
FIG. 16 is a block diagram of a memory module according to another exemplary embodiment of the inventive concept.

FIG. 16 is a block diagram of a memory module 5000D according to another embodiment of the inventive concept. The memory module 5000D shown in FIG. 16 may include a master chip 5100D and one or more slave chips 5200D mounted on a module board. For example, one master chip 5100D and n slave chips 5200D are mounted on the module board, as shown in FIG. 16.

The master chip 5100D communicates with an external memory controller 5300D, and transmits and receives a clock signal CLK, command/address signals CA, and data DQ through a system bus. The master chip 5100D may include an interface circuit (not shown) for interfacing with the memory controller 5300D, forwards a signal provided from the memory controller 5300D to the slave chips 5200D through the interface circuit, and forwards a signal provided from the slave chips 5200D to the memory controller 5300D. Each slave chip 5200D may include a memory cell array, for example, a memory cell array including DRAM cells. In addition to the interface circuit, the master chip 5100D may further include a DRAM management unit for managing the slave chips 5200D. The DRAM management unit may include a memory device operational parameter storage circuit for storing memory device operational parameter values related to memory cell arrays, a refresh scheduler for managing the refresh operation, and functional blocks related to various policies of the memory described above. The operation of the DRAM management unit related to various policies is the same as or similar to the description made in the previous embodiments, and thus will not be described in detail.

Figure 17:
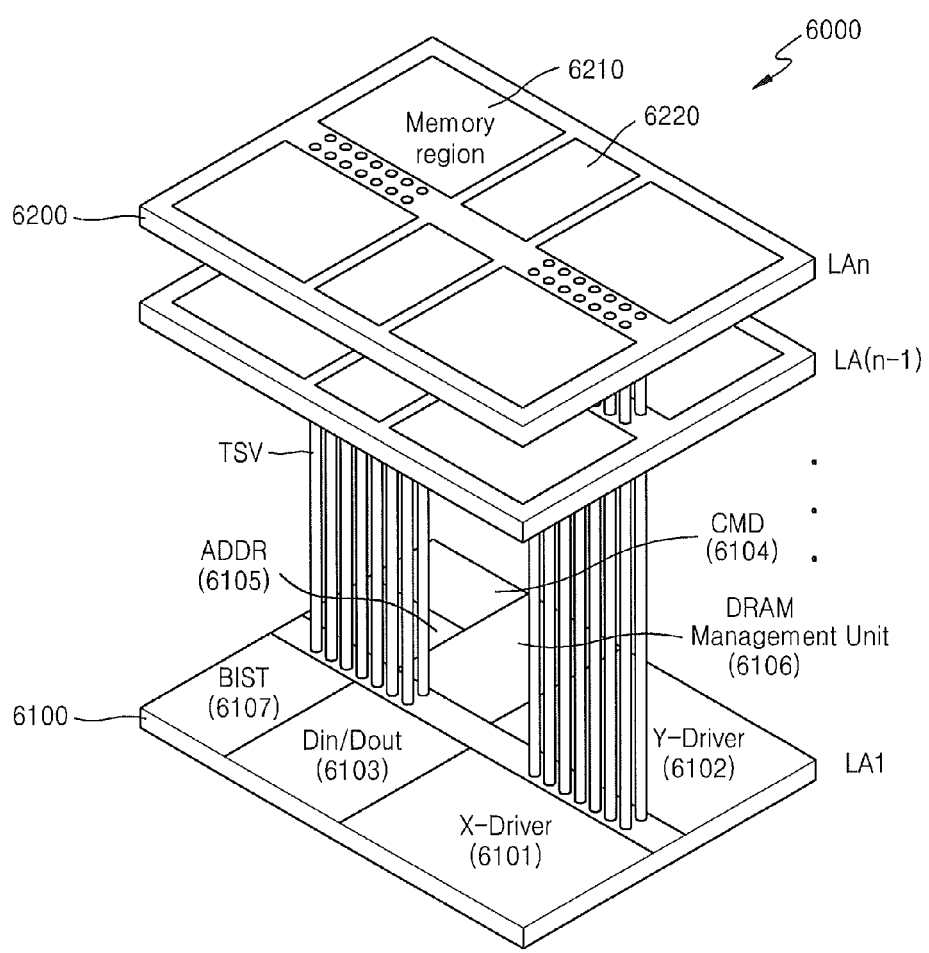
FIG. 17 is a structural diagram of a semiconductor device according to another exemplary embodiment of the inventive concept.

It will be understood that in FIGS. 17, 18*b*, a lowest most semiconductor integrated circuit layer can be an interface or control integrated circuit layer or chip, which is configured to communicate with, for example, a memory controller to operate core memory located on the other semiconductor integrated circuit layers above the lowest most semiconductor integrated circuit layer. It will be understood that, in some embodiments according to the inventive concept, the interface or control integrated circuit layer or chip does not include any core memory. Rather, the other semiconductor integrated circuit layers located above the lowest most semiconductor integrated circuit layer, include the core memory chips.

It will be understood that the control or interface layer or chip on the lowest most semiconductor integrated circuit layer can include the DRAM management unit, which may include a memory device operational parameter storage circuit in some embodiments according to the inventive concept.

FIG. 17 is a structural diagram of a device 6000 according to an exemplary embodiment of the inventive concept. As shown in FIG. 17, the device 6000 may include a plurality of first through nth semiconductor integrated circuit layers LA1 through LAn, in which the lowest first semiconductor integrated circuit layer LA1 is assumed to be an interface or control chip and the other semiconductor integrated circuit layers LA2 through LAn are assumed to be slave chips, including core memory chips. The plurality of semiconductor integrated circuit layers LA1 through LAn transmit and receive signals therebetween through through-silicon-vias (TSVs). The lowest first semiconductor integrated circuit layer LA1 as the interface or control chip communicates with an external memory controller through a conductive structure formed on an external surface. A description will be made regarding the structure and operation of the semiconductor device 6000 by mainly using the first semiconductor integrated circuit layer LA1 or 6100 as the interface or control chip and the nth semiconductor integrated circuit layer LAn or 6200 as the slave chip.

The first semiconductor integrated circuit layer 6100 may include various peripheral circuits for driving memory regions 6210 provided in the nth semiconductor integrated circuit layer 6200. For example, the first semiconductor integrated circuit layer 6100 may include a row (X)-driver 6101 for driving word lines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address.

The first semiconductor integrated circuit layer 6100 may further include a DRAM management unit 6106 for managing the memory regions 6210 provided in the nth semiconductor integrated circuit layer 6200. The DRAM management unit 6106 may include a memory device operational parameter storage circuit for storing memory device operational parameter values related to memory cell arrays, a refresh scheduler for managing the refresh operation, and functional blocks related to various policies for the memory described above in the previous embodiments. The first semiconductor integrated circuit layer 6100 may further include a BIST unit 6107 for testing a function of the semiconductor device 6000 in a built-in form. A feature of the memory cell array is discriminated according to the test result provided by the BIST unit 6107, and memory device operational parameter value corresponding to the discrimination result may be stored in the memory device operational parameter storage circuit. According to the operation of the BIST unit 6107, memory device operational parameter value may be stored during initial driving of the semiconductor device 6000 (e.g., during the power-up operation), or the semiconductor device 6000 may be periodically tested and the memory device operational parameter value may be periodically updated according to the test result. Inclusion of the BIST unit 6107 in the semiconductor device 6000 and operations of storing and updating memory device operational parameter value according to the test of the BIST unit 6107 may be applied to in the same or similar way also in the above-described embodiments of the memory modules.

The nth semiconductor integrated circuit layer 6200 may include the memory regions 6210 including memory cell arrays and peripheral circuit regions 6220 in which peripheral circuits for reading/writing data of the memory regions 6210, e.g., a row decoder, a column decoder, a bit line sense amplifier, etc. (not shown) are arranged.

In FIG. 17, unlike in the previous embodiments, data driving operations (the read, write, and refresh operations, etc.) and management operations according to various policies related to the data driving operations may be integrated in a single semiconductor device. The semiconductor device 6000 may be a three-dimensional memory device including the plurality of semiconductor integrated circuit layers LA1 through LAn, which include an interface or control chip and slave chips. The DRAM management unit 6106 is arranged in the first semiconductor integrated circuit layer 6100 as the interface or control chip. The command signal stored in the command buffer 6104 and the address signal stored in the address buffer 6105 are provided to the DRAM management unit 6106, which then performs various operations for managing the memory regions 6210 by referring to values stored in various fields of a memory device operational parameter storage circuit (not shown) provided in the DRAM management unit 6106. The DRAM management unit 6106 generates a refresh command and a refresh address for controlling the refresh operation with respect to the memory regions 6210, and the generated refresh command and refresh address are provided to slave chips through the TSVs.

FIGS. 18A and 18B are cross-sectional views of an exemplary implementation of the semiconductor device 6000 shown in FIG. 17. The semiconductor device 6000 shown in FIG. 17 may be implemented in various forms, two examples of which are shown in FIGS. 18A and 18B. As shown in FIG.

18A, a semiconductor device 6000A includes one or more semiconductor integrated circuit layers, among which the uppermost semiconductor integrated circuit layer is assumed to be an interface or control chip 6100A and the others are assumed to be slave chips 6200A. The semiconductor integrated circuit layers are deposited on a substrate 6300 including a plurality of terminals and internal interconnections. The terminal disposed on a surface of the substrate 6300 is connected to the interface or control chip 6100A through a first conductive structure, e.g., a bonding wire, and the terminal disposed on the other surface of the substrate 6300 is connected to a second conductive structure, e.g., a solder ball, for communication with an external source. The interface or control chip 6100A includes the plurality of structures connected to the first conductive structure, and signals received through the first conductive structure and the terminal are forwarded to the slave chips 6200A through TSVs formed in the slave chips 6200A. The interface or control chip 6100A may include an interface circuit for interfacing with an external source, various peripheral circuits for driving data of the memories of the slave chips 6200A, and a memory management unit including functional blocks related to policies for memory driving.

A semiconductor device 6000B shown in FIG. 18B also includes one or more semiconductor integrated circuit layers, among which the lowest semiconductor integrated circuit layer is assumed to be an interface or control chip 6100B and the others are assumed to be slave chips 6200B. The terminal disposed on a surface of the substrate 6300 is connected to the interface or control chip 6100B through a conductive structure. The interface or control chip 6100B, because of being deposited lowest, may be connected to the substrate 6300 through a flip-chip conductive structure which may be, for example, one selected from a group consisting of a conductive bump, a conductive spacer, a solder ball, and combinations thereof. A signal forwarded to the interface or control chip 6100B through the flip-chip conductive structure is forwarded to the slave chips 6200B through TSVs formed in the interface or control chip 6100B and the slave chips 6200B.

Figure 19:
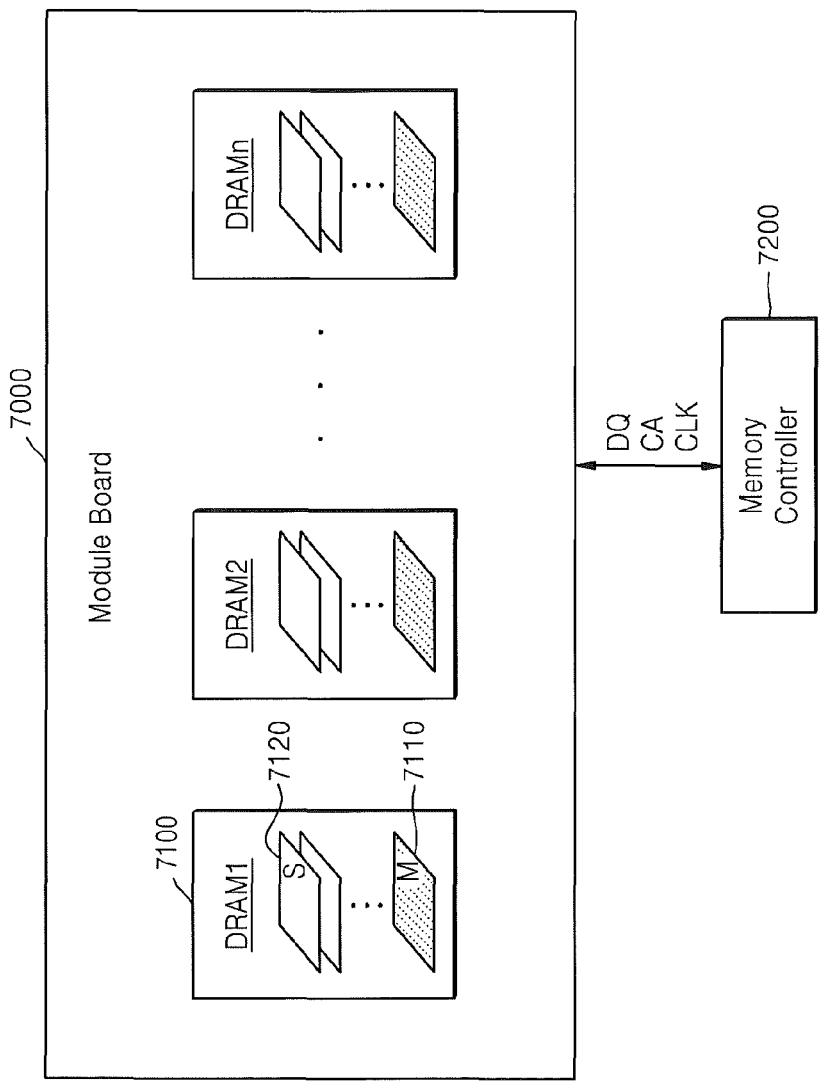
FIG. 19 shows an exemplary implementation of a memory module to which the semiconductor device shown in FIG. 17 is applied.

FIG. 19 shows an exemplary implementation of a memory module 7000 to which the semiconductor device shown in FIG. 17 is applied. As shown in FIG. 19, the memory module 7000 may include one or more semiconductor devices 7100 mounted on a module board. The semiconductor devices 7100 may be implemented with DRAM chips, each of which may include a plurality of semiconductor integrated circuit layers. The plurality of semiconductor integrated circuit layers include one or more interface or control chips 7110 and one or more slave chips 7120. The interface or control chips 7110 may include an interface circuit and a memory management unit, and the slave chips 7120 may include memory cells. The interface or control chips 7110 may also include memory cells, and in this case, signals related to memory policies, generated in the interface or control chips 7110, for example, the refresh command and the refresh address from a refresh scheduler, may be provided to the memory cells included in the interface or control chips 7110. TSVs may be used to connect signals between the semiconductor integrated circuit layers. The memory module 7000 communicates with a memory controller 7200 through a system bus, such that data DQ, command/address signals CA, a clock signal CLK, etc. are transmitted and received between the memory module 7000 and the memory controller 7200.

In the memory module 7000 shown in FIG. 19, a separate chip for managing memory operations does not need to be mounted on the module board. That is, some semiconductor integrated circuit layers of each semiconductor device 7100 may operate as interface or control chips and a management unit for memory management may be disposed in each interface or control chip. As a result, in light of the memory module 7000, the degree of integration may be improved.

Figure 20:
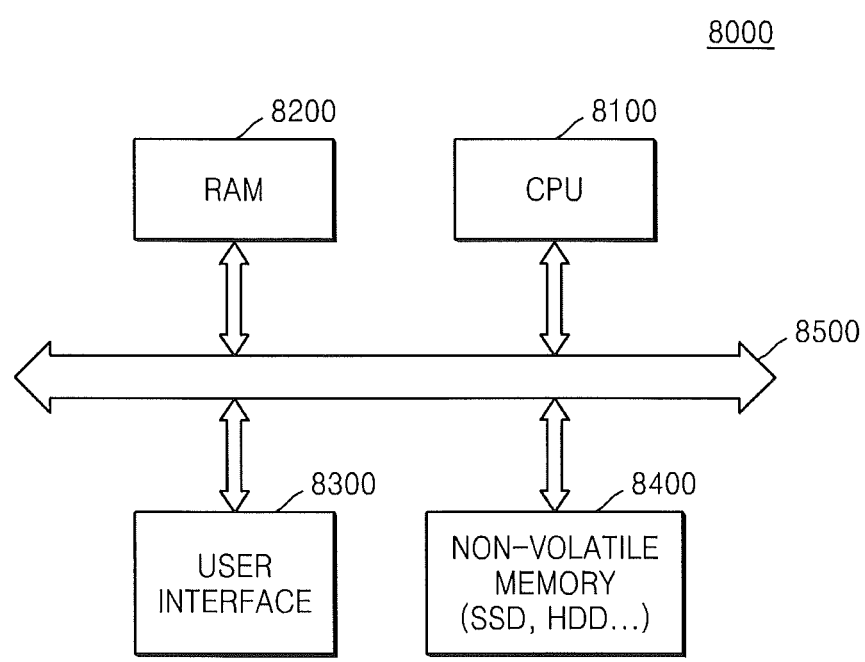
FIG. 20 is a block diagram of a computing system having mounted thereon a memory system according to an exemplary embodiment of the inventive concept.

FIG. 20 is a block diagram of a computing system 8000 having a memory system mounted thereon according to an exemplary embodiment of the inventive concept. A semiconductor device according to the inventive concept may be mounted as a RAM 8200 on an information processing system such as a mobile device or a desk top computer. The semiconductor device mounted as the RAM 8200 may comply with one of the plurality of embodiments described previously. For example, the RAM 8200 may be a semiconductor device or a memory module according to the foregoing embodiments. The RAM 8200 shown in FIG. 20 may include a memory device and a memory controller.

The computing system 8000 according to an embodiment of the inventive concept may include a CPU 8100, the RAM 8200, a user interface 8300, and a non-volatile memory 8400, which are electrically connected to a bus 8500. The non-volatile memory 8400 may be a high-capacity storage device such as a solid-state drive (SSD) or an HDD.

In the computing system 8000, the RAM 9200, as in the foregoing embodiments, may include DRAM chips including DRAM cells for storing data and a memory management chip including various functional blocks related to policies of the memory. The RAM 9200 may also include an interface or control chip including a memory management unit and slave chips including DRAM cells. The RAM 9200 may also include a plurality of semiconductor devices, each of which may include a semiconductor integrated circuit layer including a memory management unit and semiconductor integrated circuit layers including DRAM cells.

Various policies for improving memory operations are applied to the RAM 8200 and they are integrated in a memory management chip, thereby improving memory operation performance without degrading the general-purpose feature of the DRAM chip. Therefore, the RAM 8200 according to an embodiment of the inventive concept may be applied to various applications, and the memory performance of each application using memory operations may also be improved. The computing system 8000 is also applicable to desk top computers, notebook computers, and mobile devices such as cellular phones.

The description of the embodiments of the inventive concept has been provided with reference to the drawings for thorough understanding of the inventive concept, and thus should not be construed to be intended to limit the inventive concept. It is also apparent to those of ordinary skill in the art that various changes and modifications can be made without departing from the basic principle of the inventive concept.

What is claimed:

1. A memory module comprising:
    a plurality of dynamic memory devices each including a dynamic memory cell array with respective regions therein, the plurality of dynamic memory devices configured to operate the respective regions responsive to a command; and
    a DRAM management unit, on the module and coupled to the plurality of dynamic memory devices, including a memory device operational parameter storage circuit configured to store memory device operational parameters for the respective regions to affect operation of the respective regions responsive to the command, wherein the memory device operational parameters comprise refresh operational parameters to skip a requested refresh operation for each region during a refresh time interval when the each region is activated for a read/write operation during the refresh time interval before the requested refresh operation is performed.

2. The memory module of claim 1 wherein the refresh operational parameters affect refresh operations performed in the respective regions.

3. The memory module of claim 1 wherein the respective regions comprise a plurality of pages simultaneously accessed in response to a single row address.

4. A dynamic memory management circuit on a memory module comprising:
a dynamic random access memory (DRAM) operational parameter storage circuit, included in a DRAM management unit, wherein the DRAM operational parameter storage circuit is configured to store refresh operational parameters for respective regions of a DRAM configured for reference to determine, for each region, whether a requested refresh operation for each region will be skipped based on a comparison of the refresh operational parameters for each region to a master time interval flag.

5. The circuit of claim 4 wherein the refresh operational parameters comprise refresh field values and the master time interval flag indicates a current portion of a refresh time interval and comprises a first half of the refresh time interval or a second half of the refresh time interval.

6. The circuit of claim 5 wherein the refresh operational parameters comprise refresh field values and the circuit further comprises:
a refresh driver circuit, operatively coupled to the DRAM operational parameter storage circuit, configured to invert a refresh field value for a region to which a current operation is directed if an address for the current operation is scheduled for a refresh request later during the current portion of the refresh time interval based on the comparison to the master time interval flag.

7. The circuit of claim 5 wherein the refresh operational parameters comprise refresh field values and the circuit further comprises:
a refresh driver circuit, operatively coupled to the DRAM operational parameter storage circuit, configured to invert a refresh field value for a region to which a current operation is directed if an address for the current operation was scheduled for a refresh request earlier in a current portion of the refresh time interval but was skipped based on the comparison to the master time interval flag.

8. The circuit of claim 4 wherein the refresh operational parameters comprise:
refresh field values configured to indicate, for each region, whether the requested refresh operation for each region will be performed; and
dual retention field values configured to indicate, for each region, one of a plurality of different refresh time intervals for use therewith.

9. The circuit of claim 8 wherein the dual retention field values are assigned to regions based on determinations of data retention for cells in the respective regions as a function of refresh frequency.

10. The circuit of claim 9 wherein a first region having less data retention is assigned dual retention field values indicating more frequent refresh and a second region having greater data retention is assigned dual retention field values indicating less frequent refresh than the first region.

11. The circuit of claim 4 wherein the refresh operational parameters comprise dual retention field values configured to indicate, for each region, whether a requested refresh operation for each region will be performed based on a comparison of the dual retention field values for each region to the master time interval flag, which indicates a current portion of a low-frequency refresh time interval.

12. The circuit of claim 4 wherein the DRAM operational parameter storage circuit comprises a register circuit including separate refresh field values for each region.

13. The circuit of claim 4 wherein the master time interval flag indicates a current portion of a refresh time interval and the refresh time interval comprises a particular time interval within which a cell in a DRAM is refreshed to maintain data.

14. A memory module comprising:
a plurality of dynamic memory devices, on the module, each including a dynamic memory cell array with respective pages therein, the plurality of dynamic memory devices configured to operate the respective pages responsive to a command; and
a memory device operational parameter storage circuit, included in a memory buffer device on the module, operatively coupled to the plurality of dynamic memory devices, the memory device operational parameter storage circuit configured to store memory device operational parameters for the respective pages to affect operation of the respective pages responsive to the command, wherein the memory device operational parameters comprise dual retention field values indicating, for each page, one of a plurality of different refresh time intervals for use therewith, to determine whether a requested refresh operation for the each page will be skipped.

15. A method of operating a dynamic memory management circuit comprising:
storing refresh operational parameters for respective regions of a dynamic random access memory (DRAM) in a DRAM operational parameter storage circuit, the refresh operational parameters configured for reference to determine, for each region, whether a requested refresh operation for each region will be skipped; and
performing the refresh operations for the respective regions, separately, based on the refresh operational parameters.

16. The method of claim 15 wherein the refresh operational parameters comprise refresh field values configured to indicate, for each region, whether the requested refresh operation for each region will be performed, the method further comprising:
receiving the requested refresh operation for a region; and
comparing the refresh field value for the region to a master time interval flag indicating a current portion of a refresh time interval.

17. The method of claim 16 further comprising:
performing the requested refresh operation when the refresh field value for the region matches the master time interval flag; and
skipping the requested refresh operation when the refresh field value for the region does not match the master time interval flag.

18. The method of claim 16 wherein the master time interval flag indicating the current portion of refresh time interval comprises a first half of the refresh time interval or a second half of the refresh time interval.

19. The method of claim 18 further comprising:
inverting a refresh field value for a region to which a current operation is directed if an address for the current operation is scheduled for a refresh request later during the current portion of the refresh time interval based on the comparison to the master time interval flag; and inverting the refresh field value for the region to which the current operation is directed if refresh of the address for the current operation was skipped earlier in the current portion of the refresh time interval based on the comparison to the master time interval flag.

20. The method of claim 16 wherein storing the refresh operational parameters further comprises:
storing dual retention field values configured to indicate, for each region, one of a plurality of different refresh time intervals for use therewith.

21. The method of claim 15 wherein the refresh operational parameters comprise dual retention field values configured to indicate, for each region, whether the requested refresh operation for each region will be performed, the method further comprising:
receiving the requested refresh operation for a region; and
comparing the dual retention field values for the region to master time interval flags indicating a current portion of a low-frequency refresh time interval.

22. A memory module comprising:
a module board;
one or more first semiconductor chips mounted on the module board, each of the first semiconductor chips including a memory cell array with respective regions therein; and
a second semiconductor chip mounted on the module board, the second semiconductor chip comprising a storage circuit for storing operational parameters for the respective regions, such that the second semiconductor chip controls each memory cell array in the first semiconductor chips by respective region, wherein the operational parameters comprise refresh operational parameters to skip a requested refresh operation for each region during a refresh time interval when the each region is activated for a read/write operation during the refresh time interval before the requested refresh operation is performed during a refresh time interval.

23. The memory module of claim 22, wherein the respective regions comprise a plurality of pages simultaneously accessed in response to a single row address.

24. The memory module of claim 22, wherein the refresh operational parameters comprise first information related to execution of a refresh operation with respect to each of the respective regions, and
the second semiconductor chip further comprises a refresh scheduler configured to generate a refresh address by referring to the first information to selectively perform the refresh operation on the respective regions.

25. The memory module of claim 22, wherein the operational parameters further comprise a scrubbing parameter, and
the second semiconductor chip further comprises a scrubber configured to selectively monitor a region where an error bit occurs by comparing the scrubbing parameter to a scrubbing data indicating whether the error bit occurs in each of the respective regions.

26. The memory module of claim 22, wherein the operational parameters further comprise a first swapping parameter and a second swapping parameter, and
the second semiconductor chip further comprises an address swap control unit for replacing an address of a region where an uncorrectable error occurs with an address of a redundant region by comparing the first and second swapping parameters to a first swapping data and a second swapping data respectively, the first swapping data indicating whether the uncorrectable error occurs in the region and the second swapping data indicating an address of the redundant region for replacing the region where the uncorrectable error occurs.

27. The memory module of claim 22, wherein the operational parameters further comprises an operating voltage parameter, and
the second semiconductor chip controls a refresh operation with respect to the respective regions by comparing the operating voltage parameter to an operating voltage data indicating level of an operating voltage of each of the plurality of regions of the memory cell array.

28. The memory module of claim 22, wherein the operational parameters further comprise an error checking and correction (ECC) parameter, and
the semiconductor chip comprises an ECC unit for generating ECC parity having different bit numbers by comparing the ECC parameter to an ECC data indicating a number of error bits occurring in each of the respective regions.

29. The memory module of claim 22, wherein the second semiconductor chip further comprises a control unit configured to eliminate a redundant operation.

30. A memory module comprising:
a plurality of dynamic random access memory (DRAM) devices each including a dynamic memory cell array with respective regions therein, the plurality of DRAM devices configured to operate the respective regions responsive to a command; and
a DRAM management unit, on the module and coupled to the plurality of dynamic memory devices, including a memory device operational parameter storage circuit configured to store memory device operational parameters for the respective regions to eliminate scheduled redundant operations for each region by referring to the memory device operational parameters.

31. A dynamic memory management circuit comprising:
a dynamic random access memory (DRAM) operational parameter storage circuit, included in a DRAM management unit, wherein the DRAM operational parameter storage circuit is configured to store refresh operational parameters for respective regions of a DRAM configured to eliminate a scheduled redundant refresh operation for each region by referring to the refresh operational parameters.

* * * * *